US007704810B2

(12) United States Patent
Oue et al.

(10) Patent No.: US 7,704,810 B2
(45) Date of Patent: Apr. 27, 2010

(54) MANUFACTURING METHOD OF DISPLAY DEVICE

(75) Inventors: Eiji Oue, Mobara (JP); Yasukazu Kimura, Chiba (JP); Daisuke Sonoda, Chiba (JP); Toshiyuki Matsuura, Mobara (JP); Takeshi Kuriyagawa, Mobara (JP)

(73) Assignee: Hitachi Displays, Ltd., Mobara-shi (JP)

( * ) Notice: Subject to any disclaimer, the term of this patent is extended or adjusted under 35 U.S.C. 154(b) by 382 days.

(21) Appl. No.: 11/857,481

(22) Filed: Sep. 19, 2007

(65) Prior Publication Data

US 2008/0070351 A1 Mar. 20, 2008

(30) Foreign Application Priority Data

Sep. 19, 2006 (JP) .............................. 2006-252261

(51) Int. Cl.
*H01L 21/00* (2006.01)
(52) U.S. Cl. ............... 438/155; 438/252; 257/E21.035; 257/E21.346
(58) Field of Classification Search .................. 438/30, 438/153, 155, 252, 948; 257/E21.023, E21.027, 257/E21.028, E21.035–E21.039, E21.346
See application file for complete search history.

(56) References Cited

U.S. PATENT DOCUMENTS 6,756,614 B2  6/2004 Hatano et al.
6,943,086 B2  9/2005 Hongo et al.
7,071,036 B2 * 7/2006 Yang ........................... 438/149
7,157,751 B2  1/2007 Sonoda et al.
2004/0197967 A1 * 10/2004 Chen .......................... 438/154
2005/0211983 A1  9/2005 Kaitoh et al.
2007/0045627 A1 * 3/2007 Park et al. ..................... 257/66

FOREIGN PATENT DOCUMENTS

| JP | 2001-237326 | 8/2001 |
| JP | 2002-222959 | 8/2002 |
| JP | 2003-124136 | 4/2003 |
| JP | 2003-282880 | 10/2003 |
| JP | 2005-274984 | 10/2005 |

* cited by examiner

*Primary Examiner*—Ha Tran T Nguyen
*Assistant Examiner*—Daniel Whalen
(74) *Attorney, Agent, or Firm*—Antonelli, Terry, Stout & Kraus, LLP.

(57) ABSTRACT

In a display device manufacturing method including a step of forming a semiconductor film above a substrate and a step of implanting an impurity to each of a first semiconductor film in a first region of the substrate, a second semiconductor film in a second region outside the first region, and a third semiconductor film in a third region outside the first and second regions, the implanting step includes implanting an impurity in the third region so as to form a capacitor.

20 Claims, 38 Drawing Sheets

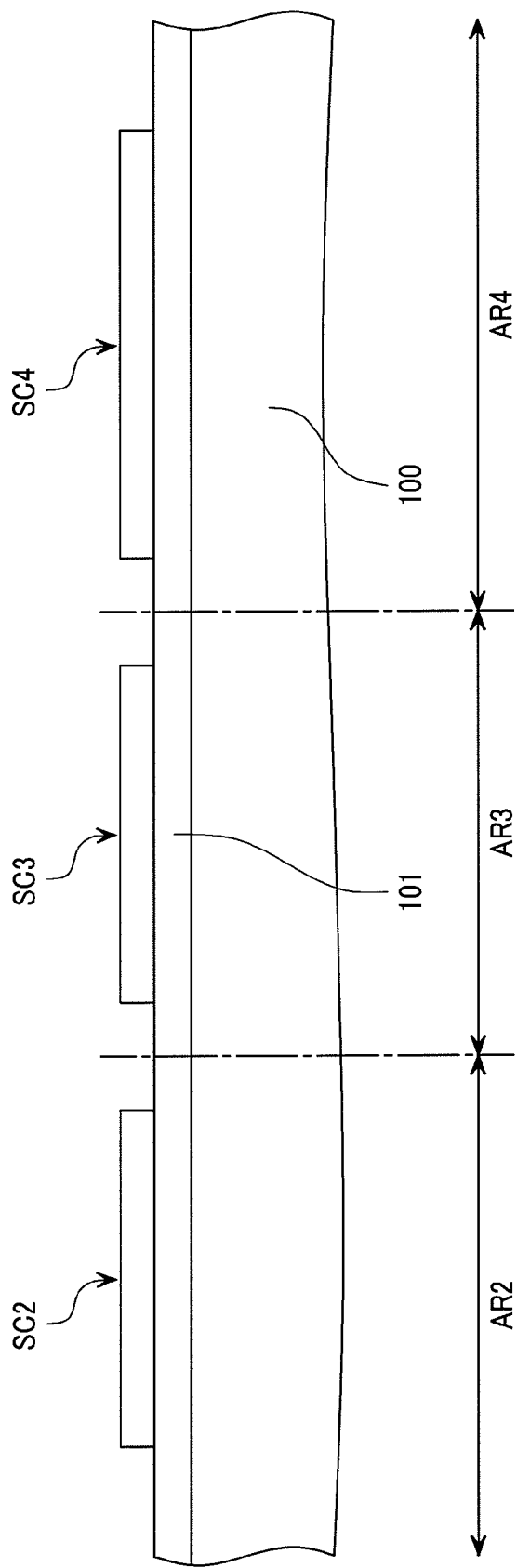

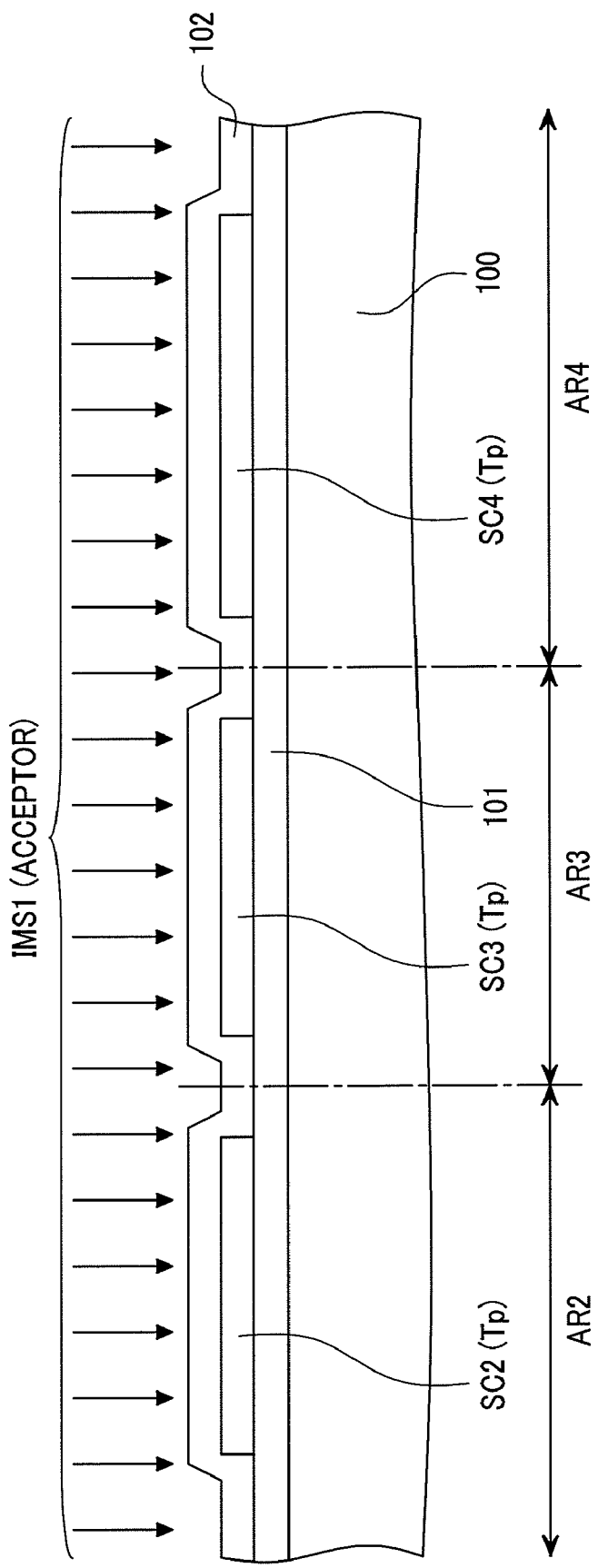

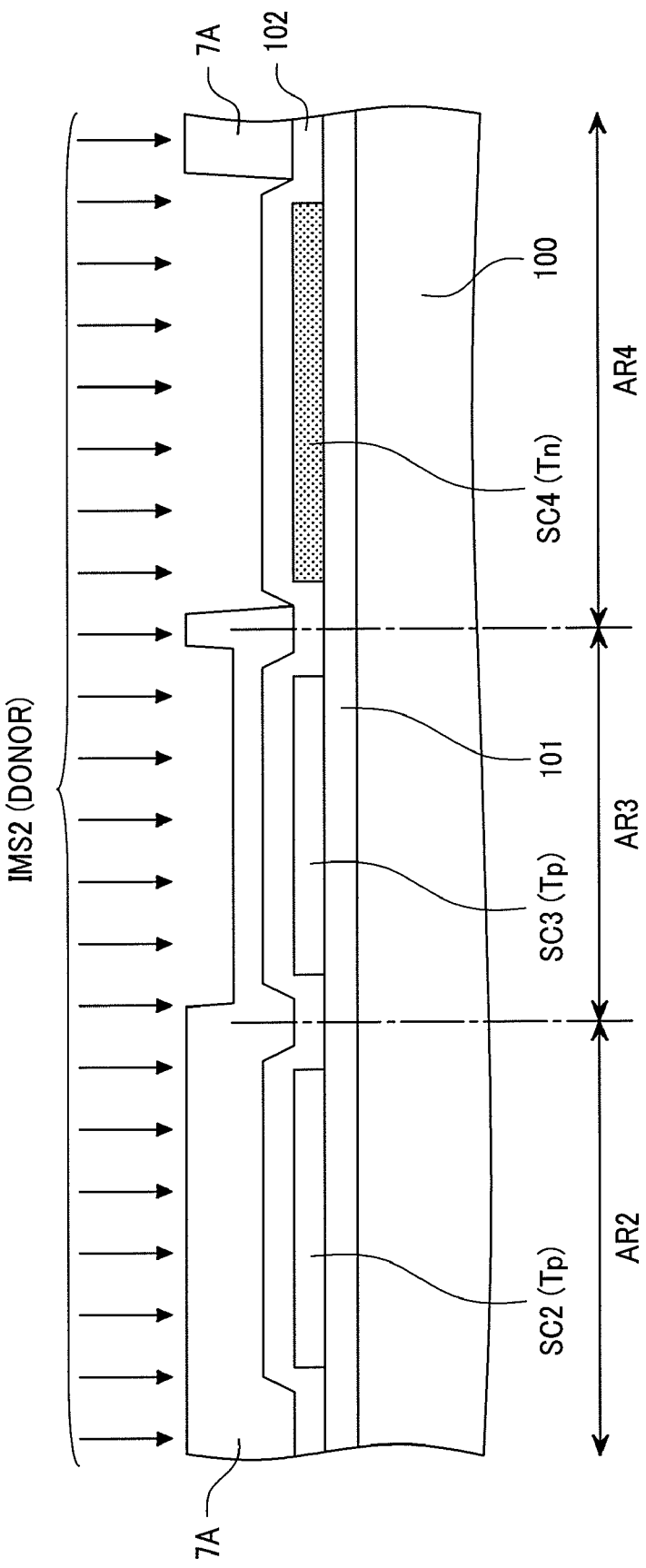

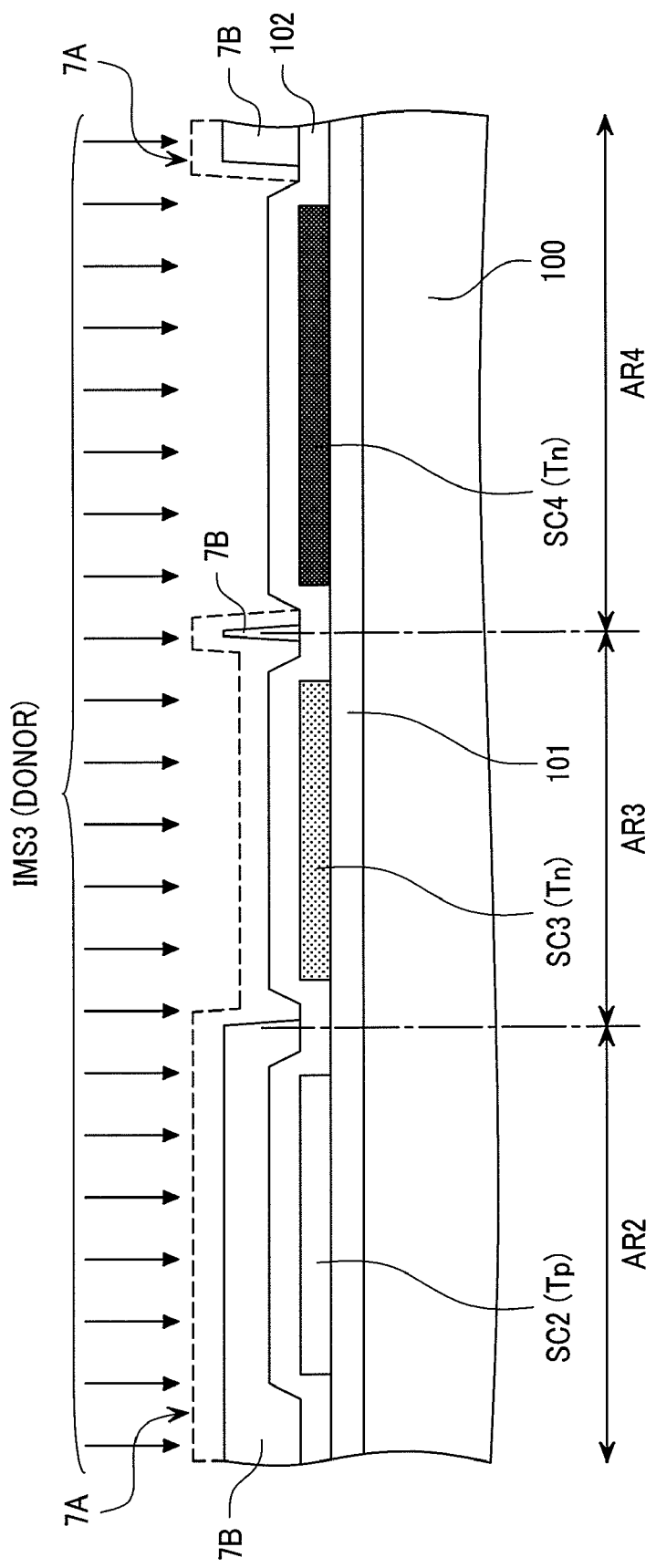

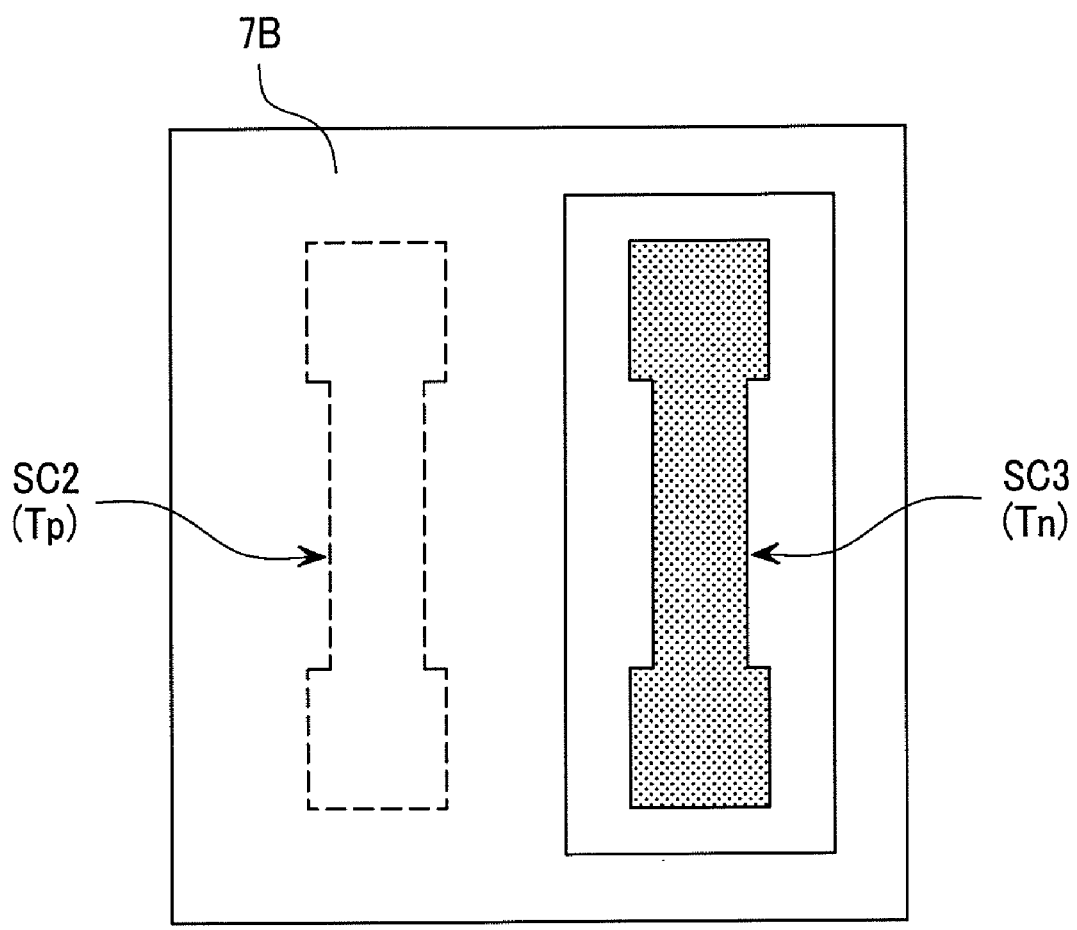

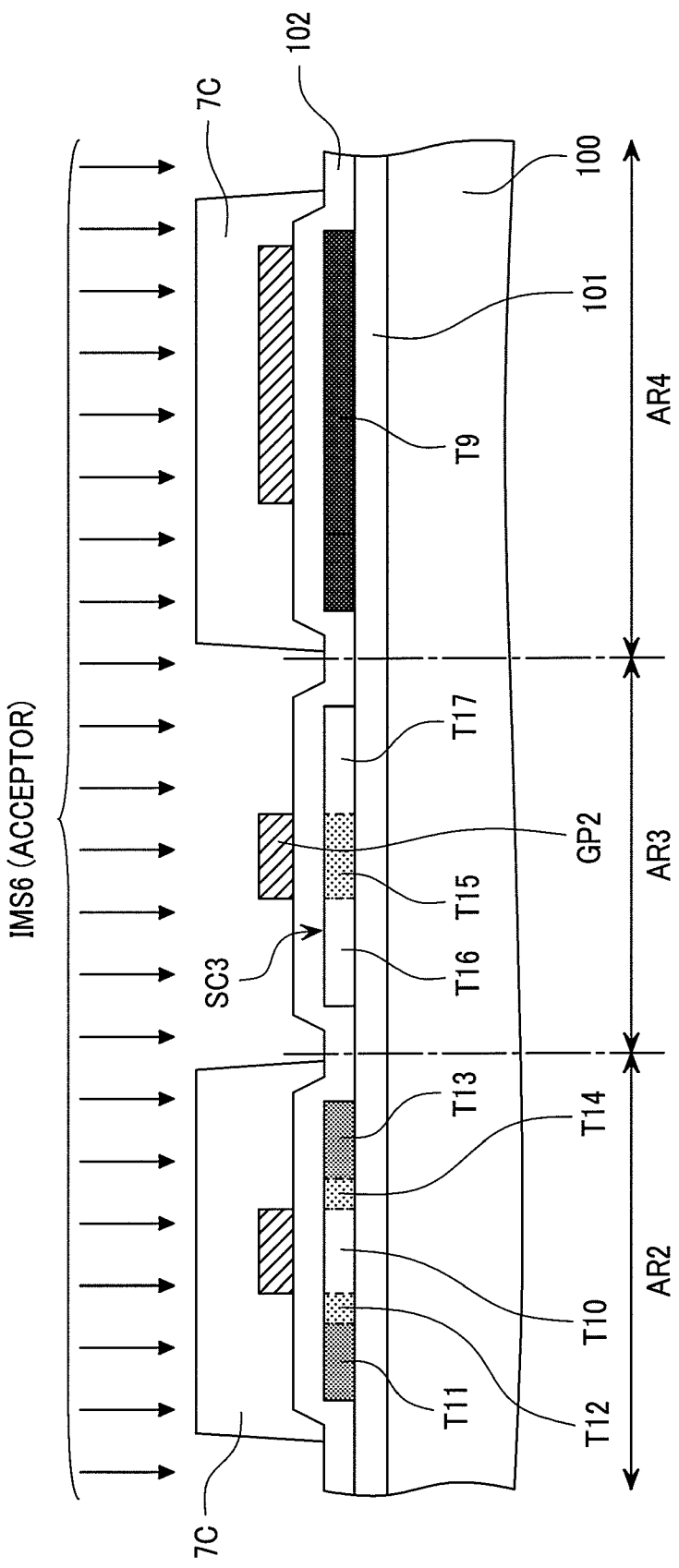

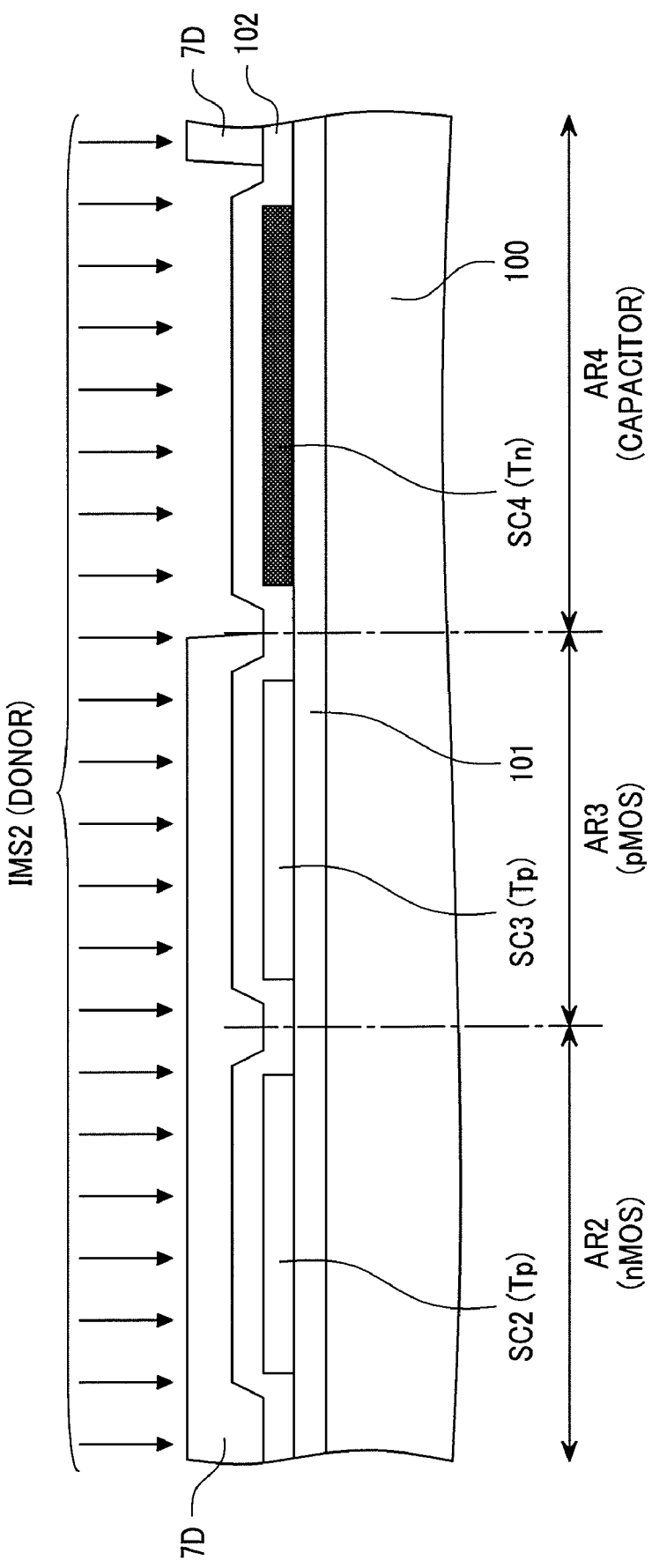

MANUFACTURING METHOD OF DISPLAY DEVICE

CLAIM OF PRIORITY

The present application claims priority from Japanese Application JP 2006-252261 filed on Sep. 19, 2006, the content of which is hereby incorporated by reference into this application.

BACKGROUND OF THE INVENTION (1) Field of the Invention

The present invention relates to a manufacturing method of a display device, in particular, to an effective technology that is applicable to a manufacturing method of an active matrix display device having a drive circuit formed outside a display area.

(2) Description of the Related Art

Among liquid crystal display devices have been an active matrix liquid crystal display devices. An active matrix liquid crystal display device has multiple active elements (also called "switching elements") arranged in the display area of a liquid crystal display panel in a matrix. Used as the active elements are, for example, thin film transistors (TFTs). In the liquid crystal display panel, each TFT basically has a metal insulator semiconductor (MIS) structure including a metal layer, an insulating layer, and a semiconductor layer. Mainly used as the semiconductor layer of each TFT is silicon (Si). If the insulator layer is made of, for example, silicon oxide film ($SiO_2$), the TFT structure is called a metal oxide semiconductor (MOS).

In conventional liquid crystal display devices, a chip-shaped driver integrated circuit (IC) has mainly been used as a drive circuit for generating a signal voltage to be applied to scan signal lines and video signal lines of a liquid crystal display panel, controlling the timing at which the voltage is applied, and doing other things. Such a driver IC, for example, may be packaged directly on a substrate (hereinafter referred to as a "TFT substrate") on which active elements (TFTs) are arranged in a matrix, in the display area of a liquid crystal display panel. A tape carrier package (TCP), a chip on film (COF), or the like, on which a driver IC is packaged, may be coupled to the TFT substrate. In recent years, there has also been proposed a liquid crystal display device in which a drive circuit that uses a TFT or the like to function as the driver IC does is formed outside the display area of the TFT substrate so as to be integral with the TFT substrate.

The drive circuit formed integrally with the TFT substrate is an IC including multiple TFT (MOS transistor) diodes, a capacitor, a resistance, and the like. The drive circuit can be formed in the process of forming scan signal lines, video signal lines, active elements (TFTS), and the like on the TFT substrate, together with these components.

If the drive circuit is formed outside the display area of the TFT substrate, an n-channel MOS transistor (hereafter referred to as an "nMOS") and a p-channel MOS transistor (hereafter referred to as a "pMOS") may be formed. In this case, the channel region of the nMOS semiconductor layer must be made a p-type or n-type semiconductor region, and the drain and source regions thereof must be made n-type semiconductor regions. The channel region of the pMOS semiconductor layer must be a p-type or n-type semiconductor region, and the drain and source regions thereof must be made p-type semiconductor regions. If the channel region of the nMOS is made an n-type semiconductor region, its donor concentration must be different from those of the drain and source regions. Similarly, if the channel region of the pMOS is made a p-type semiconductor region, its acceptor concentration must be different from those of the drain and source regions.

If a semiconductor layer (Si layer) is made a p-type semiconductor, it is a common practice to form a resist having an opening only in a region that is desired to be made a p-type semiconductor and then to ion-implant an impurity (acceptor) such as a boron ion ($B^+$) to the semiconductor layer. Similarly, if a semiconductor layer (Si layer) is made an n-type semiconductor, it is a common practice to form a resist having an opening only in a region that is desired to be made an n-type semiconductor and then to ion-implant an impurity (donor) such as a phosphorus ion ($P^+$) to the semiconductor layer. In this case, each resist is formed, for example, by applying a photosensitive resist material to the semiconductor layer, then exposing the resist material using an exposure mask, and develop the resist material. Thus, the related art impurity implantation method has had not only a problem that there is an increase in the number of exposure masks necessary to partition the semiconductor layer of the nMOS into semiconductor regions as well as to partition the semiconductor layer of the pMOS into semiconductor regions, but also a problem that there is an increase in the frequency of exposure as well as in that of development.

However, for example, the following method has been proposed in recent years as a method of reducing the number of exposure masks necessary to make semiconductor layers an n-type semiconductor(s) and a p-type semiconductor(s). In that method, an acceptor (or donor) is implanted to the semiconductor layers to make all the semiconductor layers p-type (or n-type) semiconductors; a resist is formed so as to cover a semiconductor region(s) that is desired to be made a p-type (or n-type) semiconductor and so as to have an opening above a semiconductor layer that is desired to be made an n-type (or p-type) semiconductor; and a donor (or acceptor) is implanted to only the semiconductor layer on which the resist has the opening so that the semiconductor layer is made an n-type (or p-type) semiconductor (for example, see Japanese Patent Application Laid-Open Publication No. 2003-282880). For example, if this method is used to make all the semiconductor layers p-type semiconductors and then to make the semiconductor layer above which the resist has the opening an n-type semiconductor, it is sufficient to make the amount of the donor to be implanted to the semiconductor layer above which the resist has the opening larger than the amount of the already implanted acceptor so that the donor concentration becomes higher than the acceptor concentration. This allows the semiconductor layers to be made an n-type semiconductor and p-type semiconductors using one exposure mask.

With regard to the TFT substrate of a recent liquid crystal display device, when a holding capacitance is formed for each pixel in the display area, a part of the semiconductor layer of an active element (TFT) is sometimes made conductive so as to be used as one electrode of the holding capacitance. If the active element (TFT) is an nMOS, the channel region of the semiconductor layer is made a p-type (or n-type) semiconductor, and the drain and source regions thereof and the part thereof to be used as the electrode of the holding capacitance are made n-type semiconductors. In this case, the carrier concentration (donor concentration) of the part must be approximately equal to those of the drain and source regions.

As a method of forming the semiconductor layer of the TFT if a part of the semiconductor layer is used as the electrode of the holding capacitance, for example, the following method has been proposed. In that method, an impurity (acceptor) is implanted to the entire semiconductor layer, including the part thereof to be used as an electrode of the holding capacitance, so as to make the semiconductor layer a p-type semiconductor; an impurity (donor) is implanted to only the part to be used as the electrode of the holding capacitance and the part's proximity so as to make them an n-type semiconductor; scan signal lines and holding capacitance lines are formed; and an impurity (donor) is implanted to the drain and source regions of the semiconductor layer with these lines used as masks so as to make these regions n-type semiconductors (for example, see Japanese Patent Application Laid-Open Publication No. 2005-274984).

However, if the drive circuit is formed outside the display area of the TFT substrate, for example, an nMOS and a pMOS, and a holding capacitance that uses as an electrode thereof a part of the semiconductor layer of an active element in the display area are sometimes formed on the TFT substrate.

In this case, even if the method described in Japanese Patent Application Laid-Open Publication No. 2003-282880 or Japanese Patent Application Laid-Open Publication No. 2005-274984 is used, for example, an exposure mask for making the semiconductor layers an n-type semiconductor(s) and a p-type semiconductor(s) and an exposure mask for making two types of n-type semiconductors that are different in donor concentration are required. Thus, the number of exposure masks to be created is increased, resulting in a problem of an increase in the manufacturing cost of the TFT substrate (liquid crystal display device).

Further, if the semiconductor layers are made three types of n-type semiconductors that are different in donor concentration, at least two exposure masks are also required in the related art method. Thus, the number of exposure masks to be created is increased, resulting in a problem of an increase in the manufacturing cost of the TFT substrate (liquid crystal display device).

SUMMARY OF THE INVENTION

An advantage of the present invention is to provide a technology that reduces to one the number of exposure masks to be used to form resists necessary to make three types of semiconductor layers that are different in type or concentration of an impurity to be implanted.

Another advantage of the invention is to provide a technology that reduces the number of steps of exposing and developing resists necessary to make three types of semiconductor layers that are different in type or concentration of an impurity to be implanted.

These advantages and novel features of the present invention will be apparent from the description in this specification and the accompanying drawings.

A representative one of the present invention to be disposed in this application will be described below.

(1) According to an aspect of the present invention, a manufacturing method of a display device, including the steps of forming a semiconductor film above a substrate; and implanting an impurity to each of a first semiconductor film in a first region of the substrate, a second semiconductor film in a second region outside the first region, and a third semiconductor film in a third region outside the first and second regions. The implanting step includes the steps of: (a) forming a first resist above the substrate so as to be thicker in the first region than in the second region, the first resist covering the first and second regions and having an opening in the third region; (b) implanting an impurity to only the third semiconductor film in the third region using the first resist as a mask; (c) thinning the first resist so as to form a second resist that covers the first region and has an opening in each of second and third regions; (d) implanting an impurity to the second and third semiconductor films in the second and third regions simultaneously using the second resist as a mask; and (e) implanting an impurity to the first to third semiconductor films in the first to third regions simultaneously.

(2) In the manufacturing method of a display device according to (1), step (e) may be performed after the second resist is eliminated subsequently to step (d).

(3) In the manufacturing method of a display device according to (1), step (e) may be performed before the first step.

(4) In the manufacturing method of a display device according to either one of (1) to (3), one of steps (b) and (e) may be the step of implanting an impurity for forming an n-type semiconductor, and the other step may be the step of implanting an impurity for forming a p-type semiconductor. An amount of an impurity to be implanted in step (b) is larger than an amount of an impurity to be implanted in step (e).

(5) In the manufacturing method of a display device according to either one of (1) to (4), one of steps (d) and (e) may be the step of implanting an impurity for forming an n-type semiconductor, and the other step may be the step of implanting an impurity for forming a p-type semiconductor.

(6) In the manufacturing method of a display device according to (5), an amount of an impurity to be implanted in step (d) may be larger than an amount of an impurity to be implanted in step (e).

(7) In the manufacturing method of a display device according to (5), an amount of an impurity to be implanted in step (d) may be smaller than an amount of an impurity to be implanted in step (e).

(8) In the manufacturing method of a display device according to either one of (1) to (4), steps (d) and (e) may be each the step of implanting an impurity for forming a semiconductor of identical conductivity type.

(9) In the manufacturing method of a display device according to either one of (1) to (8), further comprising the step of forming a capacitor in the third region after steps (a) to (e), the capacitor having, as an electrode, the third semiconductor film that has undergone implantation of the impurity.

(10) In the manufacturing method of a display device according to either one of (1) to (9), further comprising the step of, after steps (a) to (e), implanting an additional impurity to each of the first and second semiconductor films in the first and second regions and dividing each of the second and third semiconductor films into a channel region, a drain region, and a source region to form a metal insulator semiconductor transistor.

(11) In the manufacturing method of a display device according to either one of (1) to (10), the step of forming the semiconductor film above the substrate may include the step of forming an amorphous silicon film above the substrate; the step of converting a part or all of the amorphous silicon film into polycrystalline silicon; and the step of etching the substrate film so as to form the first to third semiconductor films in the first to third regions, respectively.

(12) In the manufacturing method of a display device according to (11), the step of converting a part or all of the amorphous silicon film into polycrystalline silicon may include the step of converting a part or all of the amorphous silicon film into first polycrystalline silicon made of an aggregate of a microcrystal or a granular crystal; and the step of converting a part or all of the first polycrystalline silicon into second polycrystalline silicon made of an aggregate of a zonal crystal extending in an elongated manner approximately in a direction.

(13) In the manufacturing method of a display device according to either one of (1) to (12), further comprising the step of, after steps (a) to (e), forming a transistor of one of p-type and n-type using the first semiconductor film in the first region, forming a transistor of conductivity type opposite to the conductivity type of the transistor in the first region using the second semiconductor film in the second region, and forming a capacitor using the third semiconductor film in the third region.

(14) In the manufacturing method of a display device according to either one of (1) to (12), further comprising the step of, after steps (a) to (e), forming a first transistor of one of p-type and n-type using the first semiconductor film in the first region, forming a second transistor of conductivity type identical to the conductivity type of the first transistor using the second semiconductor film in the second region, and forming a capacitor using the third semiconductor film in the third region.

(15) In the manufacturing method of a display device according to (14), one of the first semiconductor film of the first transistor and the second semiconductor film of the second transistor may be polycrystalline silicon that is an aggregate of a zonal crystal and the other semiconductor film may be polycrystalline silicon that is an aggregate of a microcrystal or a granular crystal.

(16) According to an aspect of the present invention, a manufacturing method of a display device, including the steps of: forming a semiconductor film above a substrate; and implanting an impurity to each of a first semiconductor film in a first region of the substrate, a second semiconductor film in a second region outside the first region, and a third semiconductor film in a third region outside the first and second regions, wherein the implanting step includes the steps of: (a) forming a first resist above the substrate using half-exposure so as to be thinner in the second region than in the first region, the first resist covering the first and second regions and having an opening in the third region; (b) implanting an impurity to only the third semiconductor film in the third region using the first resist as a mask; (c) thinning the first resist so as to form a second resist that covers the first region and has an opening in each of second and third regions; (d) implanting an impurity to the second and third semiconductor films in the second and third regions simultaneously using the second resist as a mask; and (e) implanting an impurity to the first to third semiconductor films in the first to third regions simultaneously.

(17) In the display device manufacturing method according to (16), step (e) is performed after the second resist is eliminated subsequently to step (d).

(18) In the display device manufacturing method according to (16), step (e) is performed before step (a).

(19) In the display device manufacturing method according to (16), one of steps (b) and (e) is the step of implanting an impurity for forming an n-type semiconductor; the other step is the step of implanting an impurity for forming a p-type semiconductor; and an amount of an impurity to be implanted in step (b) is larger than an amount of an impurity to be implanted in step (e).

(20) In the display device manufacturing method according to (16), one of steps (d) and (e) is the step of implanting an impurity for forming an n-type semiconductor, and the other step is the step of implanting an impurity for forming a p-type semiconductor.

According to the aspect of the present invention, use of the resist formed using one exposure mask allows the semiconductor films in the regions on the substrate to be made three types of semiconductors that are different in impurity concentration or impurity type.

The three types of semiconductors are combined arbitrarily. For example, one p-type semiconductor and two n-type semiconductors that are different in donor concentration may be combined or two p-type semiconductors that are different in acceptor concentration and one n-type semiconductor may be combined. Three n-type semiconductor layers that are different in donor concentration or three p-type semiconductors that are different in acceptor concentration may be combined.

Also, the three semiconductor films may be all made of amorphous silicon or may be all made of polycrystalline silicon. These semiconductor films may be a combination of a semiconductor film(s) made of amorphous silicon and a semiconductor film(s) made of polycrystalline silicon. A semiconductor film made of polycrystalline silicon may be made of polycrystalline silicon that is the aggregate of microcrystals or granular crystals or may be made of polycrystalline silicon (may be called "pseudo-monocrystal silicon") that is the aggregate of zonal crystals extending in an elongated manner approximately in one direction.

BRIEF DESCRIPTION OF THE DRAWINGS

Embodiments of the present invention will be described in detail with reference to the accompanying drawings, wherein:

FIG. 6A is a schematic sectional view showing the state immediately after semiconductor layers has been formed on a first insulating layer;

FIG. 7 is a schematic sectional view showing a step of making the semiconductor layers in the three regions into p-type semiconductors;

FIG. 8A is a schematic sectional view showing a step of changing the semiconductor layer in the region for forming a capacitor from a p-type semiconductor to an n-type one;

FIG. 9A is a schematic sectional view showing the step of changing a semiconductor layer in the region for forming a pMOS from a p-type semiconductor to an n-type one;

FIG. 9B is a schematic plan view showing an example of the plan pattern of a second resist in the region for forming an nMOS, the region for forming a PMOS, and these regions' vicinities;

FIG. 14 is a schematic sectional view showing a step of forming a p-type region in the semiconductor layer in the region for forming a pMOS;

FIG. 15A is a schematic sectional view showing an example of a step of implanting an impurity to a semiconductor layer in a region for forming a capacitor using a related art method;

DETAILED DESCRIPTION OF THE PREFERRED EMBODIMENTS

Figure 1A:
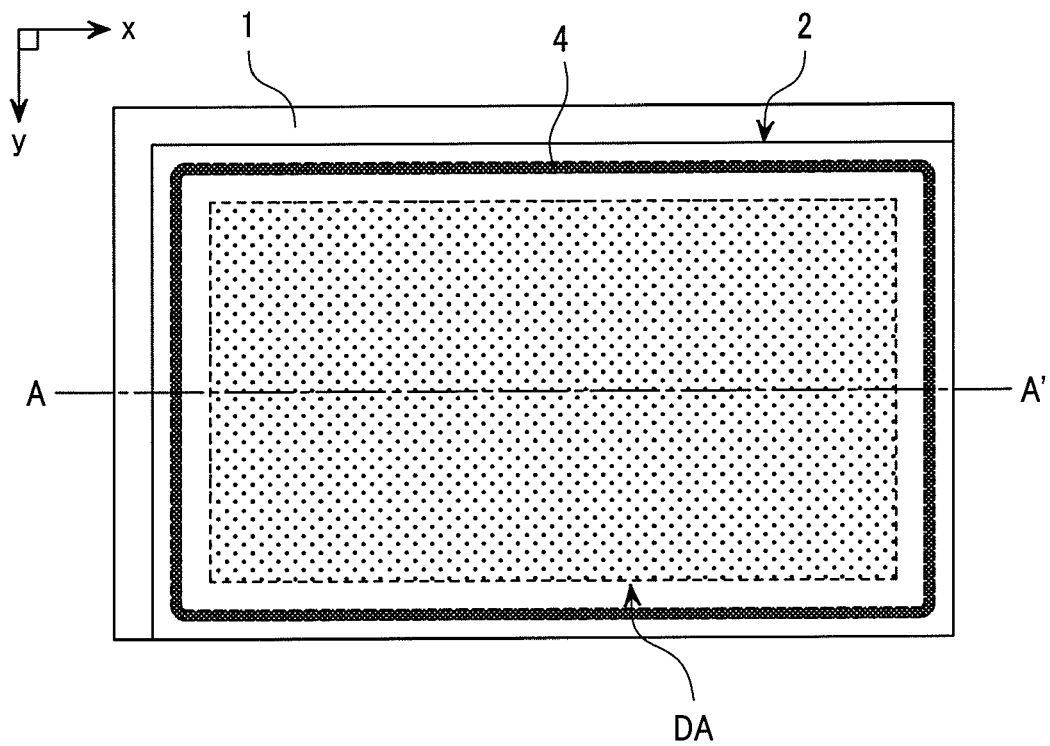
FIG. 1A is a schematic plan view showing the configuration of a liquid crystal display panel to which the present invention is applicable.

The present invention will now be described in conjunction with embodiments thereof with reference to the accompanying drawings, wherein:

In those drawings to describe the embodiments, elements having like functions are given like reference numerals and will not repeatedly be described.

Figure 1B:
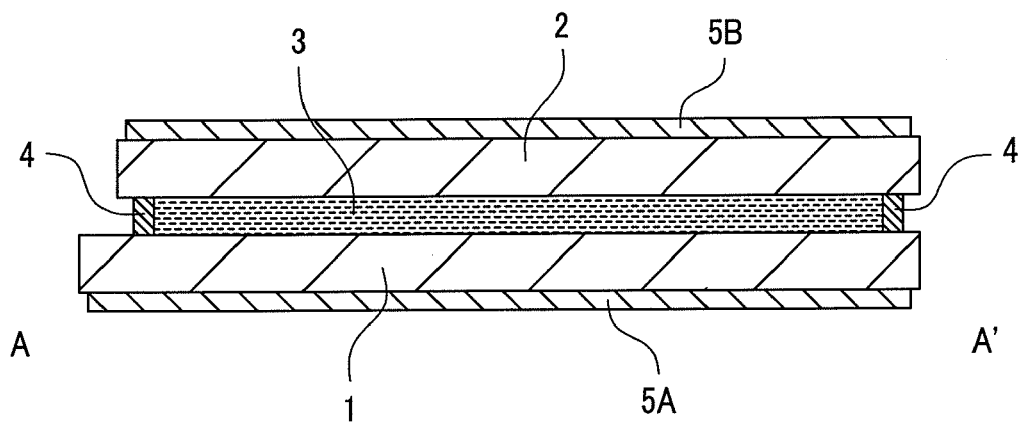
FIG. 1B is a schematic sectional view of the liquid crystal display panel taken along line A-A' of FIG. 1A.
Figure 2:
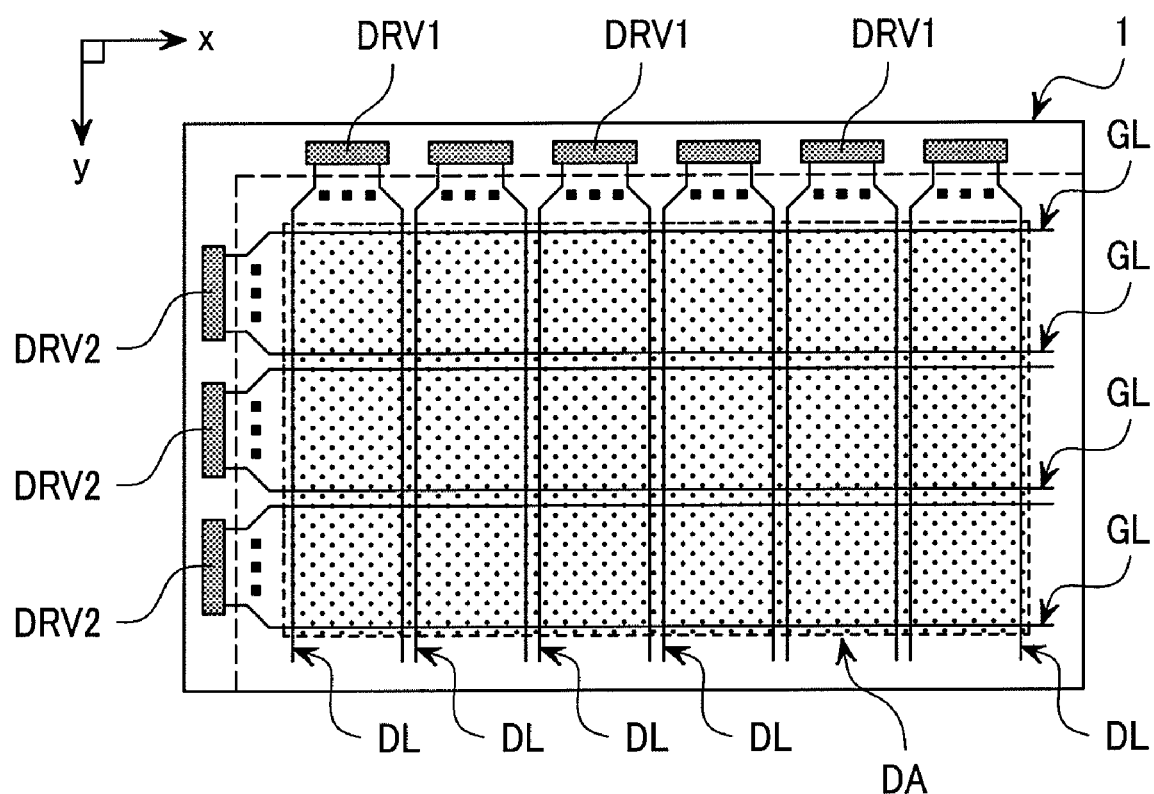
FIG. 2 is a schematic plan view showing an example of the configuration of a TFT substrate to be used in the liquid crystal display panel.

FIG. 1A is a schematic plan view showing the configuration of a liquid crystal display panel to which the present invention is applicable. FIG. 1B is a schematic sectional view of the liquid crystal display panel taken along line A-A' of FIG. 1A. FIG. 2 is a schematic plan view showing an example of the configuration of a TFT substrate to be used in the liquid crystal display panel.

The present invention is applicable, for example, to a method for manufacturing a TFT substrate for use in a liquid crystal display panel of an active matrix liquid crystal display device.

The liquid crystal display panel is, for example, a display panel in which a liquid crystal material 3 is sealed between a first substrate 1 and a second substrate 2, as shown in FIGS. 1A and 1B. In this case, the first and second substrates 1 and 2 are bonded together using a sealing material 4, which is provided outside a display area DA in the form of a ring. The liquid crystal material 3 is sealed in the space enclosed by the first and second substrates 1 and 2 and the sealing material 4.

If the liquid crystal display panel is of transmission or semi-transmission type, polarizing plates (polarizing films) 5A and 5B are bonded to the outer surfaces of the first and second substrates 1 and 2, respectively. Although not shown, a single-layer or multilayer phase difference plate (phase difference film) may be interposed between the first substrate 1 and polarizing plate 5A and between the second substrate 2 and polarizing plate 5B.

If the liquid crystal display panel is of reflection type, a polarizing plate (not shown) is bonded, for example, to only the outer surface of the second substrate 2. Also, a single-layer or multilayer phase difference plate (phase difference film) may be interposed between the second substrate 2 and the polarizing plate.

In the active matrix liquid crystal display panel, TFT elements to be used as active elements (also referred to as "switching elements") are arranged in a matrix in the display area DA on the first substrate 1. Hereinafter, the first substrate 1 will be referred to as "the TFT substrate 1."

On the TFT substrate 1, multiple scan signal lines GL that extend in the x direction and passes the display area DA transversely are arranged in the y direction and multiple video signal lines DL that extend in the y direction and passes the display area DA longitudinally are arranged in the x direction, as shown in FIG. 2. The multiple scan signal lines GL and the multiple video signal lines DL are provided so as to intersect each other with an insulating layer interposed therebetween. The active elements (TFT elements), which are not shown in FIG. 2, are disposed, for example, in the proximities of intersections of the scan signal lines GL and the video signal lines DL. The gate of each TFT element is coupled to each scan signal line GL, the drain thereof is coupled to each video signal line DL, and the source thereof is coupled to a pixel electrode.

In the TFT substrate 1 to which the present invention is applicable, first drive circuits DRV1 that are coupled to the video signal lines DL and second drive circuits DRV2 that are coupled to the scan signal lines GL are formed outside the display area so as to be integral with the TFT substrate 1. Each first drive circuit DRV1 is a circuit for generating a voltage to be applied to each video signal line DL and controlling the timing at which the signal voltage is applied. These circuits are integrated circuits that function similarly to a conventional driver IC called a data driver or the like. Each second drive circuit DRV2 is a circuit for generating a voltage to be applied to each scan signal line GL and controlling the timing at which the signal voltage is applied. These circuits are integrated circuits that function similarly to a conventional driver IC called a scan driver or the like. The first drive circuits DRV1 and second drive circuits DRV2 are, for example, integrated circuits each including multiple n-channel MOS transistors, a p-channel MOS transistor, a diode, a capacitor, and a resistance.

While the first drive circuits DRV1 and second drive circuits DRV2 are preferably formed inside the sealing material 4, in other words, between the sealing material 4 and display area DA, they may be formed in a region that overlaps the sealing material 4 in a plan view, or outside the sealing material 4.

Figure 3A:
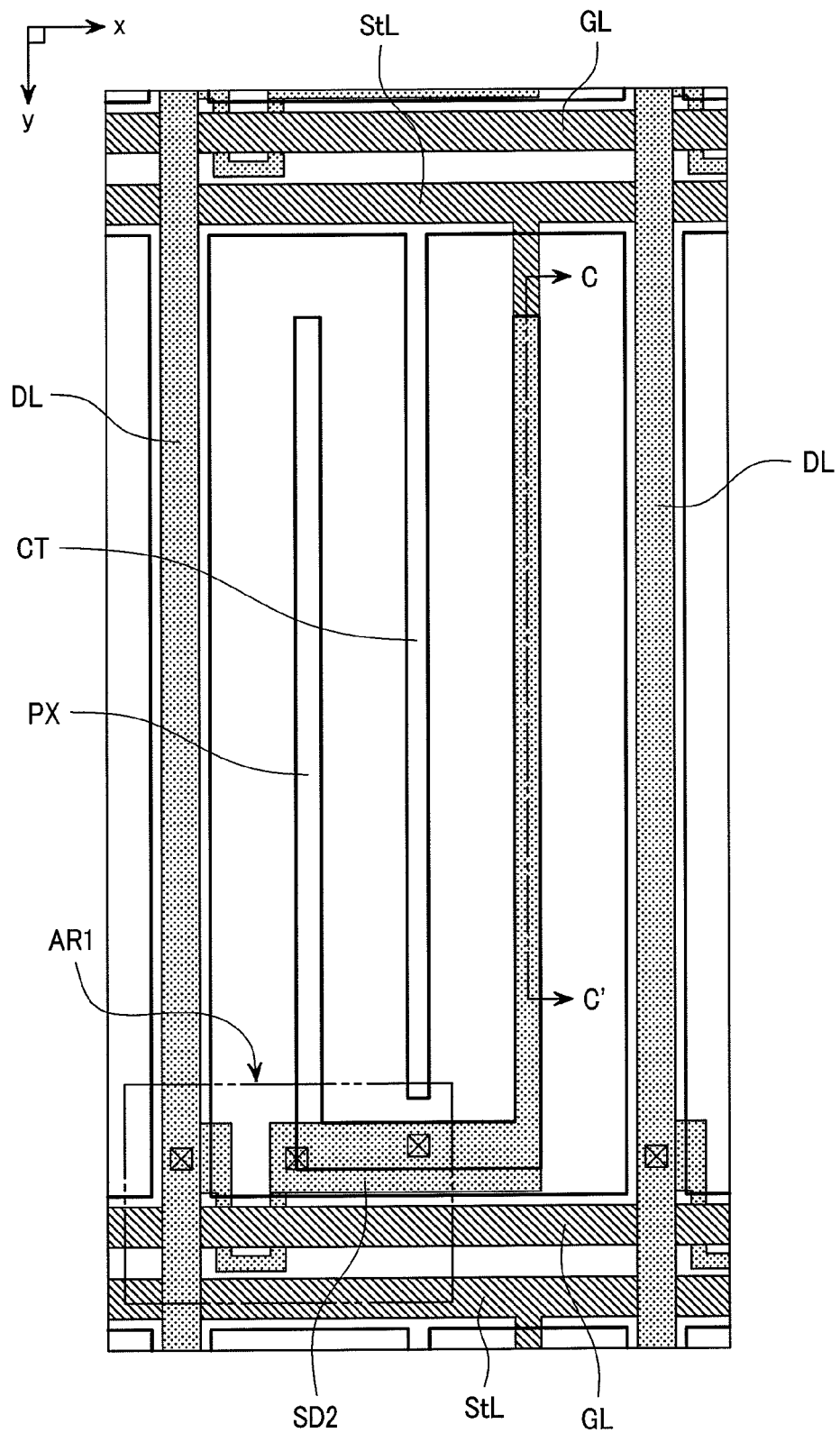
FIG. 3A is a schematic plan view showing a configuration example of a pixel of the display area of the TFT substrate to which the present invention is applicable.
Figure 3B:
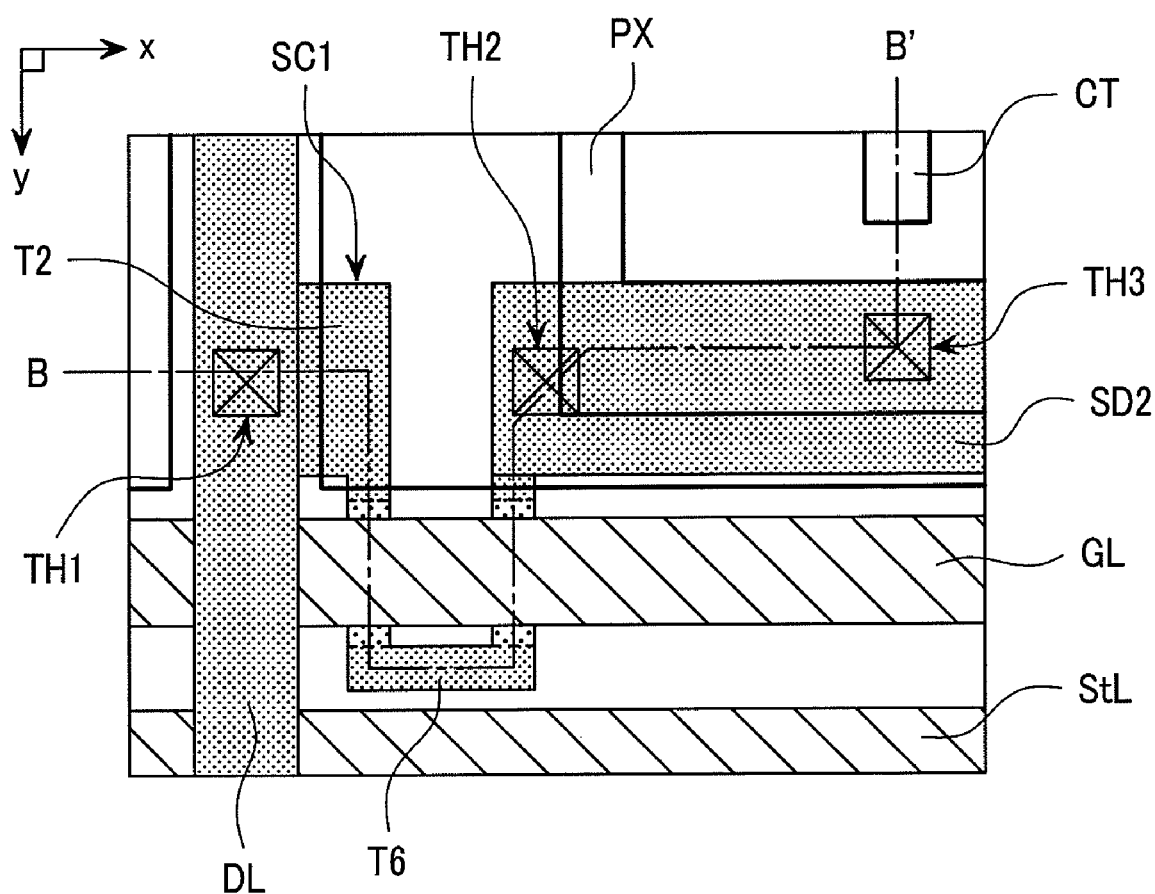
FIG. 3B is an enlarged schematic plan view showing an area AR1 of FIG. 3A.
Figure 3C:
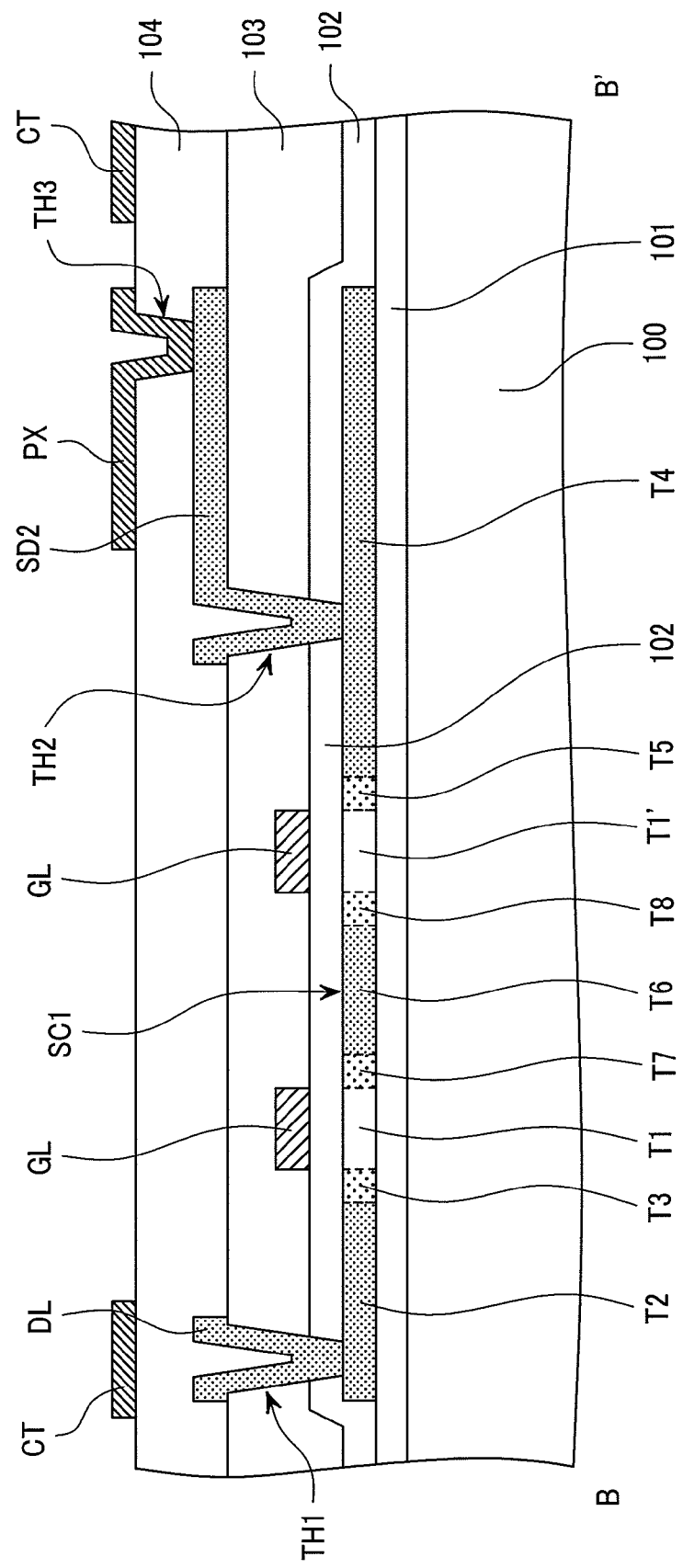
FIG. 3C is a schematic sectional view of a switching element taken along line B-B' of FIG. 3B.
Figure 3D:
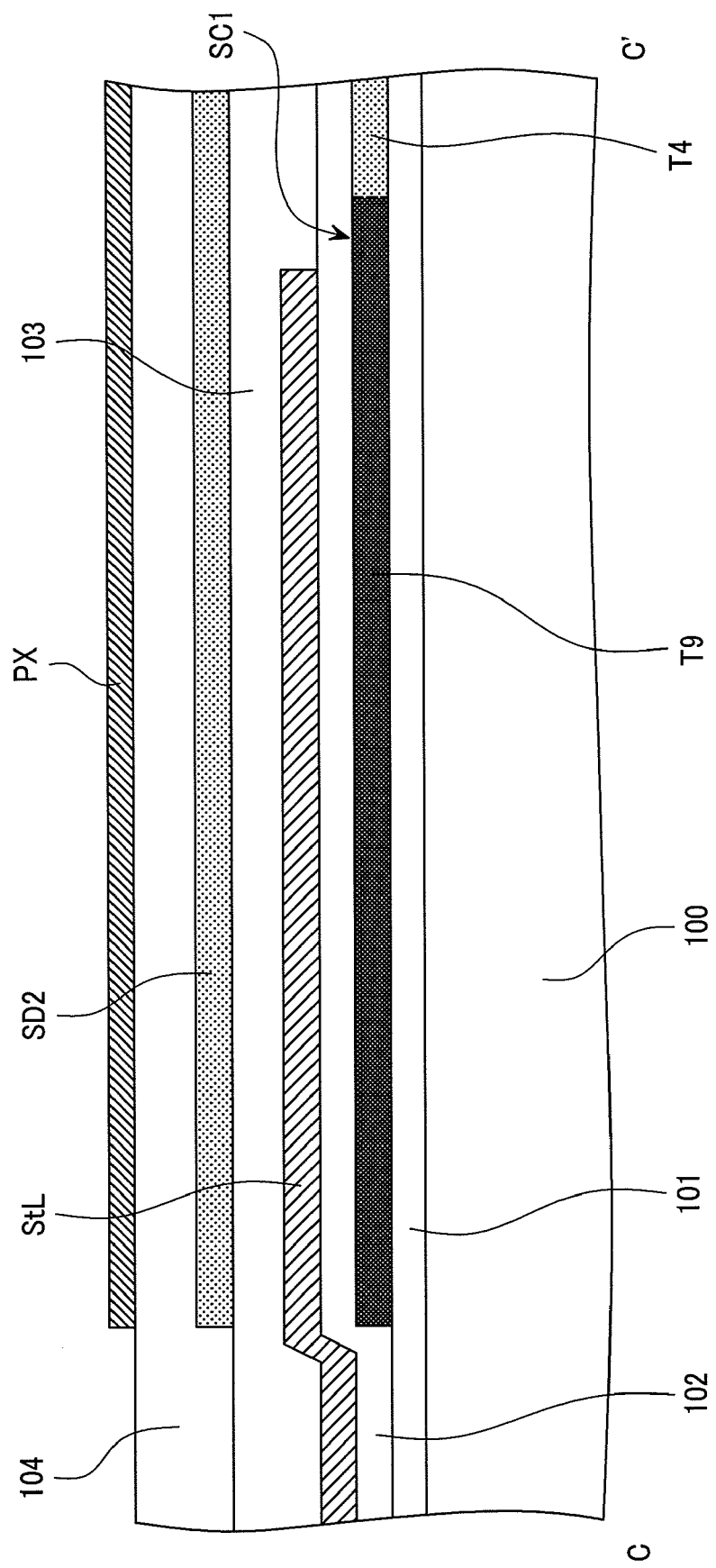
FIG. 3D is a schematic sectional view of a holing capacitance taken along line C-C' of FIG. 3A.

FIG. 3A is a schematic plan view showing a configuration example of a pixel of the display area of the TFT substrate to which the present invention is applicable. FIG. 3B is an enlarged schematic plan view showing an area AR1 of FIG. 3A. FIG. 3C is a schematic sectional view of a switching element taken along line B-B' of FIG. 3B. FIG. 3D is a schematic sectional view of a holing capacitance taken along line C-C' of FIG. 3A.

For example, a pixel of the display area DA of the TFT substrate 1 to which the present invention is applicable has the configuration shown in FIGS. 3A to 3D. Initially, a first insulating layer 101 is formed on a surface of an insulating substrate such as a glass substrate 100. Formed on the first insulating layer 101 is a semiconductor layer SC1 of an active element. The first insulating layer 101 may be made up of a single-layer or two or more layers. The scan signal lines GL, holding capacitance lines StL, and the like are formed above the semiconductor layer SC1 with a second insulating layer 102, which serves as the gate insulating film of the active element, interposed therebetween.

As shown in FIGS. 3B and 3C, the semiconductor layer SC1 meanders in the form of U and has overlaps with the scan signal lines GL in a plan view. The regions of the scan signal lines GL that overlap the semiconductor layer SC1 in a plan view serve as gates of the active elements. If the active elements are n-channel MOS transistors (hereafter referred to as "nMOS") each having a lightly doped drain (LDD) structure, regions (channel regions) T1 and T1' of the semiconductor layer SC1 that overlap the scan signal lines GL in a plan view serve as, for example, p-type semiconductor regions (hereafter referred to as "p-type regions"), and regions T2, T3, T4, T5, T6, T7, T8, and T9 other than the channel regions T1 and T1' serve as n-type semiconductor regions (hereafter referred to as "n-type regions"). The channel regions T1 and T1' of the semiconductor layer SC1 may be, for example, n-type semiconductor regions that are different in impurity concentration (donor concentration) from other n-type regions.

The two consecutive n-type regions T2 and T3 of the semiconductor layer SC1 are drain regions. The donor concentration of the n-type region T3 that is adjacent to the channel region T1 is lower than that of the n-type region T2 that is remote from the channel region T1. The two consecutive n-type regions T4 and T5 of the semiconductor layer SC1 are source regions. The donor concentration of the n-type region T5 that is adjacent to the channel region T1' is lower than that of n-type region T4 that is remote from the channel region T1'. With regard to the three consecutive n-type regions T6, T7, and T8 of the semiconductor layer SC1 that lie between the two channel regions T1 and T1', the donor concentrations of the n-type region T7 that is closest to the channel region T1 and the n-type region T8 that is closest to the channel region T1' are lower than that of n-type region T6 that is remote from both the channel regions T1 and T1'.

One of the video signal lines DL, a source electrode SD2, and the like are formed above the scan signal lines GL, the holding capacitance lines StL, and the like with a third insulating layer 103 therebetween. A part of the video signal line DL is formed so as to overlap a part of the drain region (n-type region T2) of the semiconductor layer SC1 in a plan view. The video signal line DL is coupled to the n-type region T2 of the semiconductor layer SC1 via a through hole TH1 provided in the overlapping part. A part of the source electrode SD2 is formed so as to overlap a part of the source region (n-type region T4) of the semiconductor layer SC1 in a plan view. The source electrode SD2 is coupled to the n-type region T4 of the semiconductor layer SC1 via a through hole TH2 provided in the overlapping part.

A pixel electrode PX and a common electrode CT (may be referred to as a "counter electrode") are formed above the video signal line DL and the source electrode SD2, and the like with a fourth insulating layer 104 therebetween. A part of the pixel electrode PX is formed so as to overlap the source electrode SD2 in a plan view. The pixel electrode PX is coupled to the source electrode SD2 via a through hole TH3 provided in the overlapping part.

As shown in FIGS. 3A and 3D, a part of the holding capacitance line StL branches off and extends in the y direction. A part of the source electrode SD2 extends in the y direction so as to overlap the part of the holding capacitance line StL extending in the y direction in a plan view. Formed in the overlap between the holding capacitance StL and the source electrode SD2 is a first holding capacitance that uses the holding capacitance StL and the source electrode SD2 as a pair of electrodes and uses a third insulating layer 103 interposed therebetween as a dielectric material.

For example, a part of the source region (n-type region T4) of the semiconductor layer SC1 of the active element extends so as to overlap a part of the source electrode SD2 that serves as an electrode of the first holding capacitance in a plan view, as shown in FIG. 3D. Then the source region (n-type region T4) leads to the n-type region T9 whose donor concentration is approximately equal to that of the source region (the n-type region T4) and higher than those of the channel regions T1 and T1'. Formed in the overlap between the holding capacitance line StL and the n-type region T9 of the semiconductor layer SC1 in a plan view is a second holding capacitance that uses the holding capacitance StL and the n-type region T9 of the semiconductor layer SC1 as a pair of electrodes and uses the second insulating layer 102 interposed therebetween as a dielectric material.

Figure 4A:
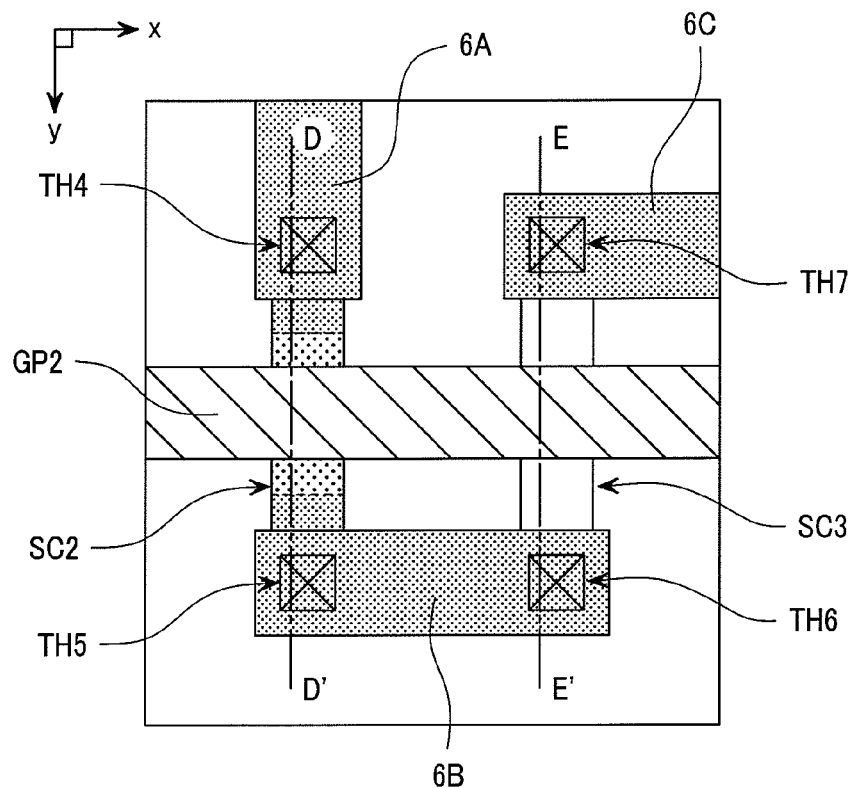
FIG. 4A is a schematic plan view showing a configuration example of a MOS transistor formed outside the display area of the TFT substrate to which the present invention is applicable.
Figure 4B:
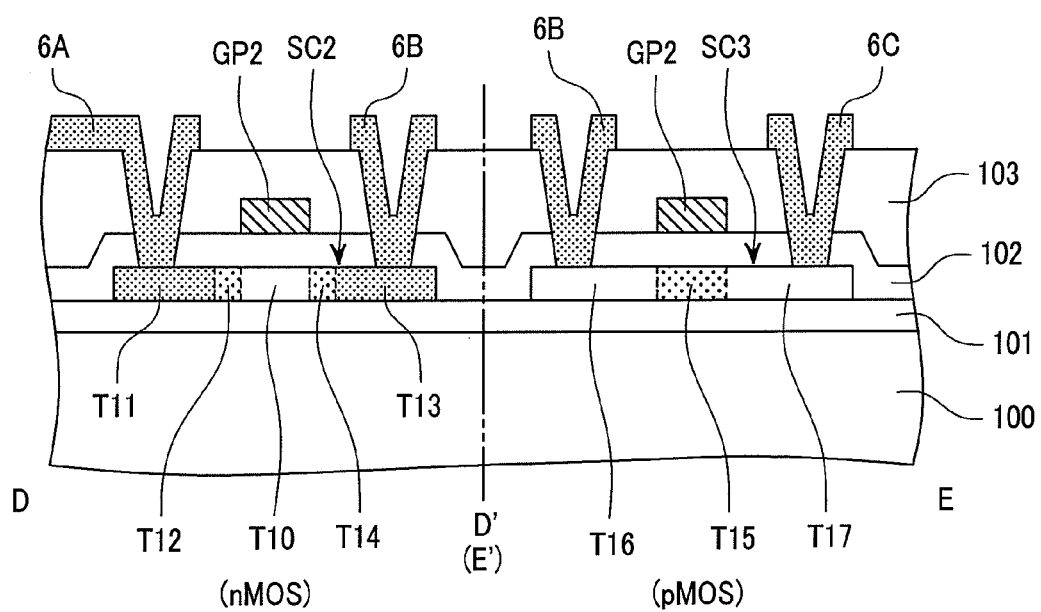
FIG. 4B is a schematic sectional view in which the sectional configuration of an n-type MOS transistor taken along line D-D' of FIG. 4A and the sectional configuration of a p-type MOS transistor taken along line E-E' of FIG. 4A are placed side-by-side.

FIG. 4A is a schematic plan view showing a configuration example of a MOS transistor formed outside the display area of the TFT substrate to which the present invention is applicable. FIG. 4B is a schematic sectional view in which the sectional configuration of an n-type MOS transistor taken along line D-D' of FIG. 4A and the sectional configuration of a p-type MOS transistor taken along line E-E' of FIG. 4A are placed side-by-side.

For example, integrated circuits such as the first drive circuits DRV1 and second drive circuits DRV2 are formed outside the display area DA of the TFT substrate 1 to which the present invention is applicable. In this case, for example, a complementary MOS (CMOS) in which an nMOS and a p-channel transistor (hereafter referred to as a "pMOS") are coupled in series is formed outside the display area DA. The CMOS has, for example, the configuration shown in FIGS. 4A and 4B. Initially, the first insulating layer 101 is formed on a surface of an insulating layer such as the glass substrate 100. Formed above the first insulating layer 101 are a semiconductor layer SC2 of the nMOS and a semiconductor layer SC3 of the pMOS. Gate electrodes GP2 are formed above the semiconductor layers SC2 and SC3 with the second insulating layer 102, which serves as the gate insulating film of the nMOS and the pMOS, interposed therebetween.

For example, the semiconductor layer SC2 and SC3 are formed in an elongated manner in the y direction in a plan view, and one of the gate electrodes GP2 is formed so as to extend in the x direction to intersect the semiconductor layers SC2 and SC3 in a plan view. In this case, a part of the gate electrode GP2 that overlaps the semiconductor layer SC2 in a plan view serves as the gate of the nMOS and a part of the gate electrode GP2 that overlaps the semiconductor layer SC3 in a plan view serves as the gate of the pMOS.

For example, if the nMOS has an LDD structure, a region (channel region) T10 of the semiconductor layer SC2 that overlaps the gate electrode GP2 in a plan view serves as a p-type region, and regions T11, T12, T13, and T14 other than the channel region T10 serve as n-type regions. The channel region T10 may be an n-type semiconductor region that is different in donor concentration from other n-type regions. The two consecutive n-type regions T11 and T12 of the semiconductor layer SC2 are source regions. The donor concentration of the n-type region T12 that is adjacent to the channel region T10 is lower than that of n-type region T11 that is remote from the channel region T10. The other two consecutive n-type regions T13 and T14 of the semiconductor layer SC2 are drain regions. The donor concentration of the n-type region T14 that is adjacent to the channel region T10 is lower than that of n-type region T13 that is remote from the channel region T10.

With regard to the semiconductor layer SC3 of the pMOS, a region (channel region) T15 that overlaps the gate electrode GP2 in a plan view serves as an n-type region, and regions T16 and T17 other than the channel region T15 serve as p-type regions. The channel region T15 may be a p-type semiconductor region that is different in acceptor concentration from other p-type regions. Of the two p-type regions T16 and T17 of the semiconductor layer SC3, the T16 is a source region and the T17 is a drain region.

Metal wiring 6A, 6B, and 6C and the like are formed above the gate electrode GP2 via the third insulating layer 103. The metal wiring 6A is coupled to the source region (n-type region T11) of the semiconductor layer SC2 of the nMOS via a through hole TH4. The metal wiring 6B is coupled to the drain region (n-type region T13) of the semiconductor layer SC2 of the nMOS via a through hole TH5, as well as coupled to the source region (p-type region T16) of the semiconductor layer SC3 of the pMOS via a through hole TH6. The metal wiring 6C is coupled to the drain region (n-type region T17) of the semiconductor layer SC3 via a through hole TH7.

Although not shown in FIG. 4B, a fourth insulating layer 104 is formed on the metal wiring 6A, 6B, and 6C.

The above-mentioned configuration is an example of the configuration of the TFT substrate 1 to which the present invention is applicable. Without being limited to this, the invention is applicable to any TFT substrate 1 that has a configuration similar to the above-mentioned configuration.

Now a method of manufacturing the TFT substrate 1 that has the configuration shown in FIGS. 3A to 3D and FIGS. 4A and 4B, and a configuration example of a TFT substrate that has a configuration other than that configuration and to which the present invention is applicable and a method of manufacturing such a TFT substrate will be described focusing attention on the procedure for implanting an impurity to a semiconductor layer.

First Embodiment

Figure 5:
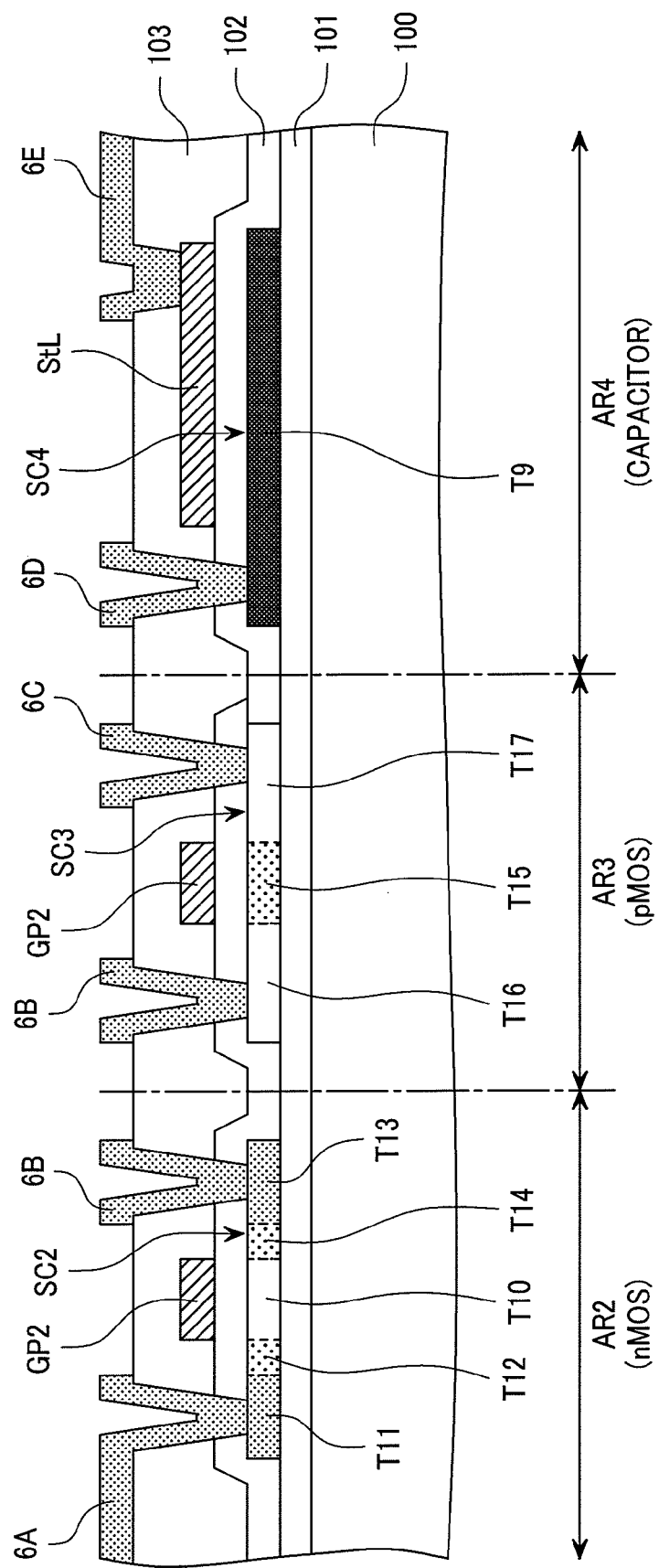
FIG. 5 is schematic sectional view showing the configuration of MOS transistors and a capacitor formed using a manufacturing method according to a first embodiment of the present invention.

FIG. 5 is schematic sectional view showing an example of the configuration of MOS transistors and a capacitor formed using a manufacturing method according to a first embodiment of the present invention.

A method of manufacturing the TFT substrate 1 according to the first embodiment will now be described using a case in which an nMOS and a pMOS, and a capacitor using a high concentration n-type semiconductor layer as an electrode are formed above the glass substrate 100, as shown in FIG. 5.

The sectional configuration of a region AR2 for forming an nMOS shown in FIG. 5 is similar to that taken along line D-D' of FIG. 4A. The sectional configuration of a region AR3 for forming a pMOS shown in FIG. 5 is similar to that taken along line E-E' of FIG. 4A. Therefore, the configurations of the nMOS and the pMOS shown FIG. 5 will not be described.

The sectional configuration of the region AR4 for forming a capacitor shown in FIG. 5 conceptually shows a portion related to the present invention, of the sectional configuration taken along line C-C' of FIG. 3A. In the region AR4 for forming a capacitor, for example, the first insulating layer 101 is formed on a surface of the glass substrate 100. Formed on the first insulating substrate 101 is a semiconductor layer SC4 to be used as the lower electrode of a capacitor. For example, the semiconductor layer SC4 entirely serves as the n-type region T9. The semiconductor layer SC4 is a semiconductor layer whose donor concentration is approximately equal to that of the source region (n-type region T13) of the nMOS and higher than those of the channel regions T10 and T15 and that is regarded as a conductive layer.

The holding capacitance line StL to be used as the upper electrode of the capacitor is formed above the semiconductor layer SC4 with the second insulating layer 102 therebetween. For example, metal wiring 6D and 6E are formed above the holding capacitance line StL with the third insulating layer 103 therebetween. The metal wiring 6D is coupled to the semiconductor layer SC4 via a through hole, and the metal wiring 6E is coupled to the holding capacitance line StL via a through hole.

A procedure for forming the nMOS, pMOS, and the capacitor shown in FIG. 5 will be described below.

FIG. 6A to FIG. 14 are schematic diagrams showing an example of the manufacturing method of a TFT substrate according to the first embodiment.

Figure 6B:
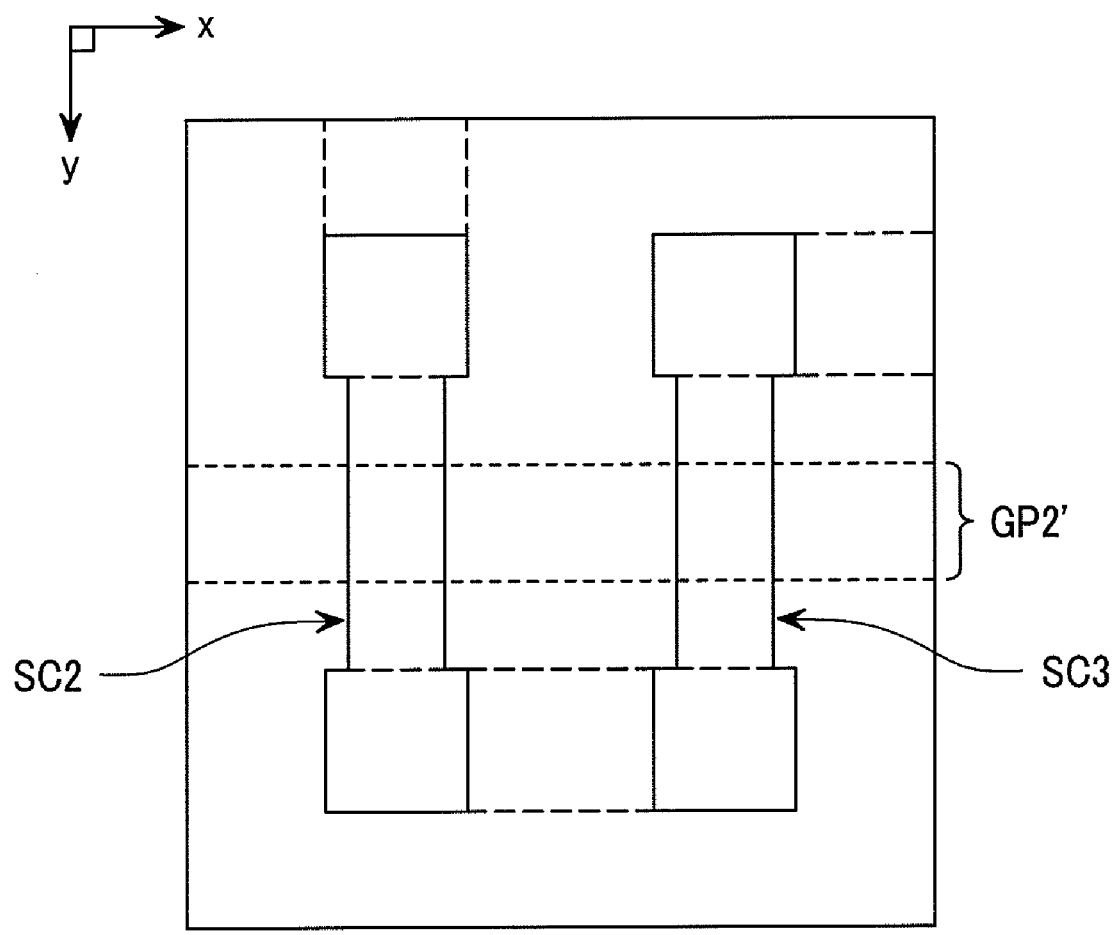
FIG. 6B is a schematic plan view showing an example of the plan patterns of a semiconductor layer in a region for forming an nMOS and that in a region for forming a pMOS.
Figure 6C:
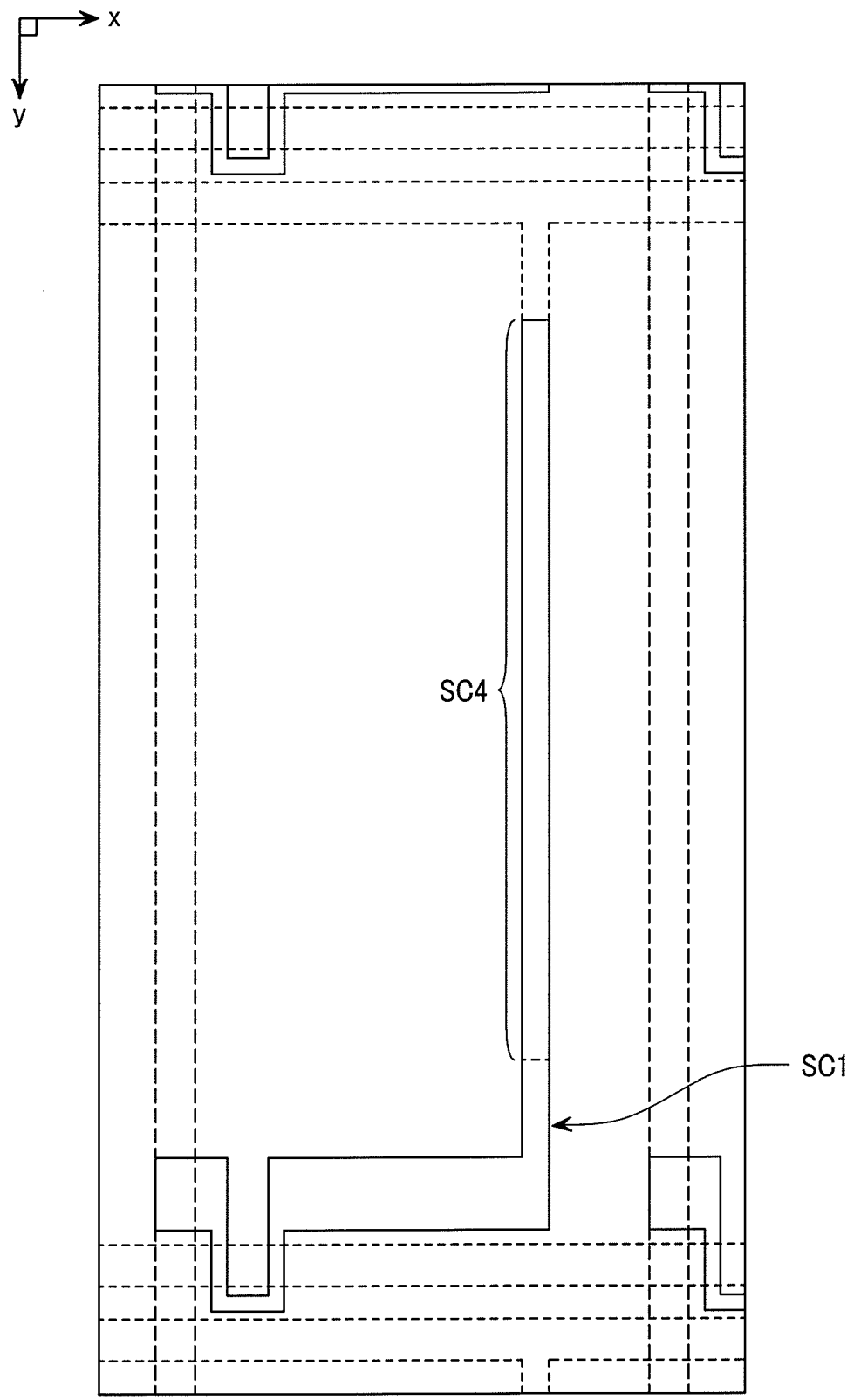
FIG. 6C is schematic plan view showing an example of the plan pattern of a semiconductor layer in a region for forming a capacitor.

FIG. 6A is a schematic sectional view showing the state immediately after semiconductor layers have been formed on a first insulating layer. FIG. 6B is a schematic plan view showing an example of the plan patterns of a semiconductor layer in a region for forming an nMOS and that in a region for forming a pMOS. FIG. 6C is schematic plan view showing an example of the plan pattern of a semiconductor layer in a region for forming a capacitor.

FIG. 7 is a schematic sectional view showing the step of making the semiconductor layers in the three regions into p-type semiconductors.

Figure 8B:
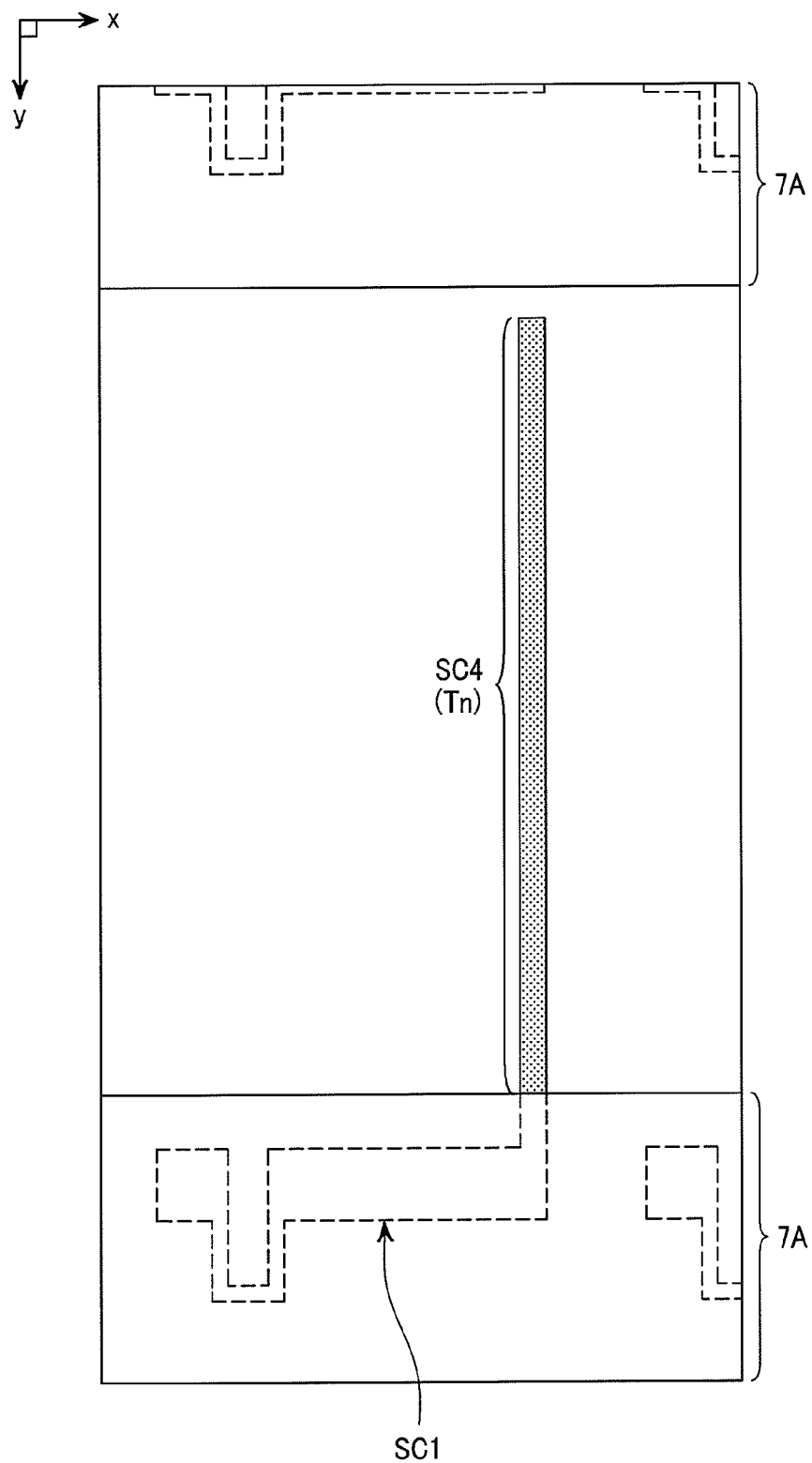
FIG. 8B is a schematic plan view showing an example of the plan pattern of a first resist in the region for forming a capacitor and the region's vicinity.

FIG. 8A is a schematic sectional view showing the step of changing the semiconductor layer in the region for forming a capacitor from a p-type semiconductor to an n-type one. FIG. 8B is a schematic plan view showing an example of the plan pattern of a first resist in the region for forming a capacitor and the region's vicinity.

FIG. 9A is a schematic sectional view showing the step of changing the semiconductor layer in the region for forming a pMOS from a p-type semiconductor to an n-type one. FIG. 9B is a schematic plan view showing an example of the plan pattern of a second resist in the region for forming an nMOS, the region for forming a pMOS, and these regions' vicinities.

Figure 10:
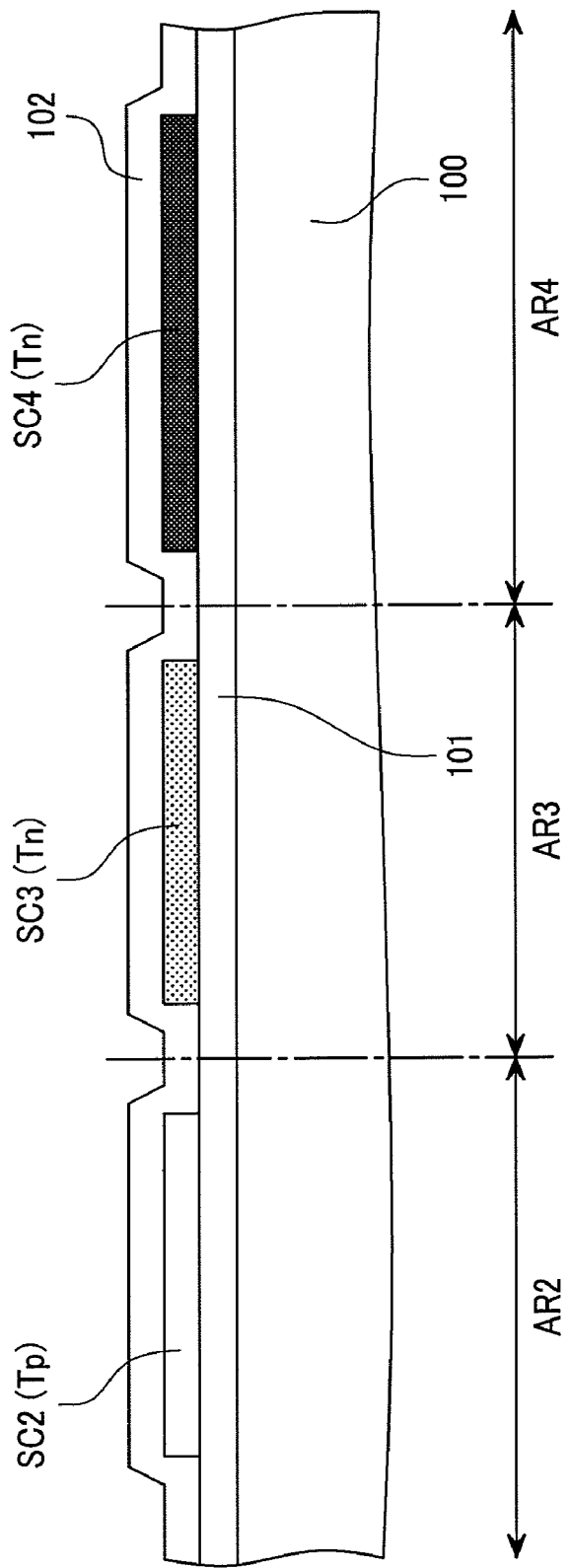
FIG. 10 is a schematic sectional view showing the state immediately after the second resist has been eliminated.

FIG. 10 is a schematic sectional view showing the state immediately after the second resist has been eliminated.

Figure 11:
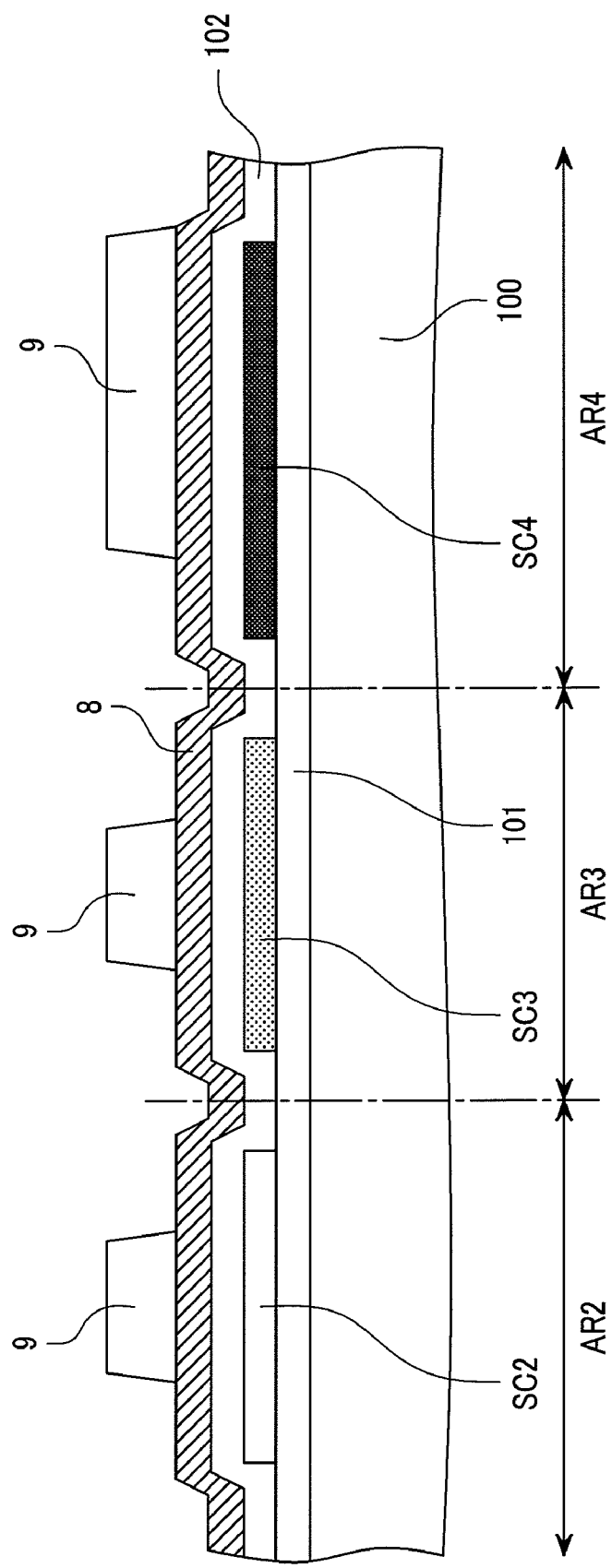
FIG. 11 is a schematic sectional view showing the state immediately after an etching resist has been formed on a conductive film.

FIG. 11 is a schematic sectional view showing the state immediately after an etching resist has been formed on a conductive film.

Figure 12:
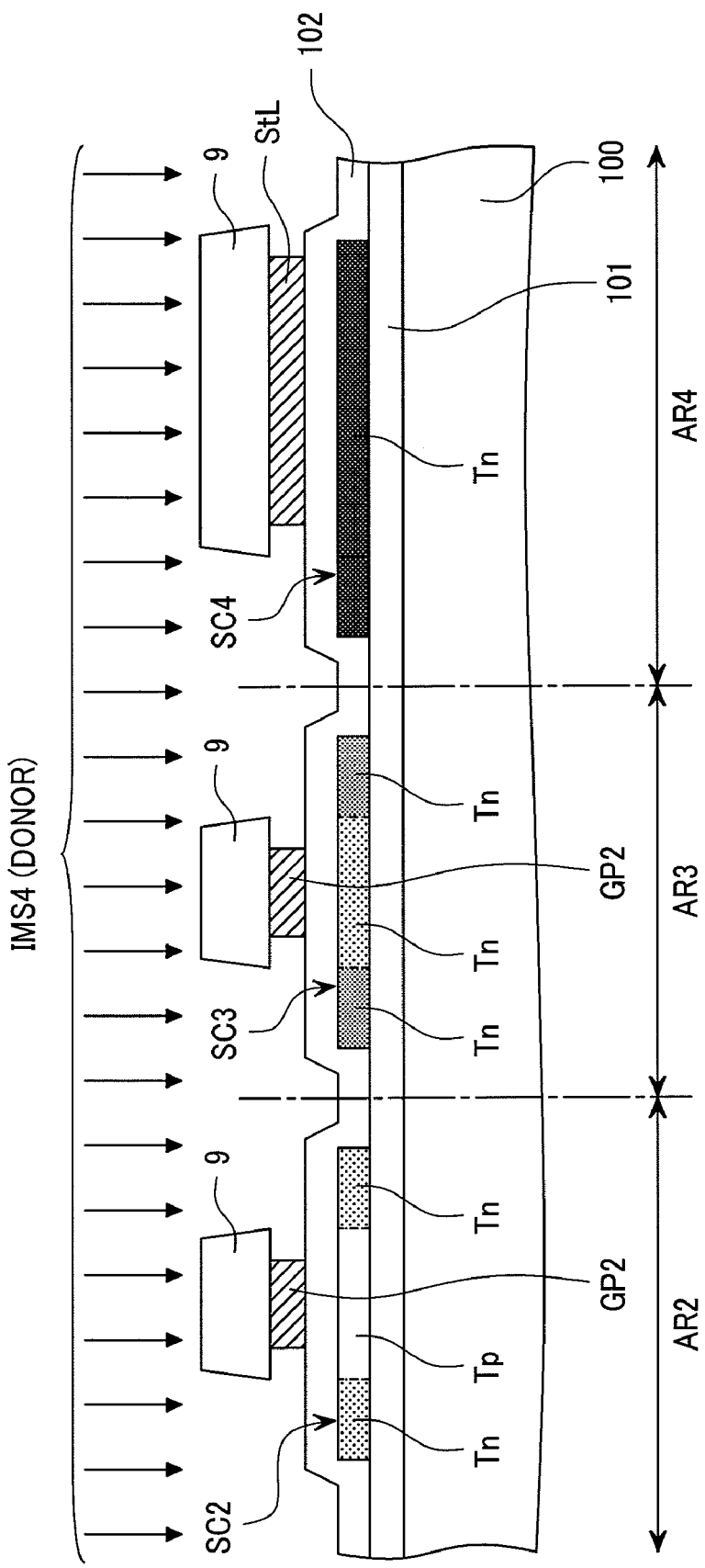
FIG. 12 is a schematic sectional view showing a first step in the step of forming an n-type region in the semiconductor layer in the region for forming an nMOS after the conductive film has been etched.

FIG. 12 is a schematic sectional view showing a first step in the step of forming an n-type region in the semiconductor layer in the region for forming an nMOS after the conductive film has been etched.

Figure 13:
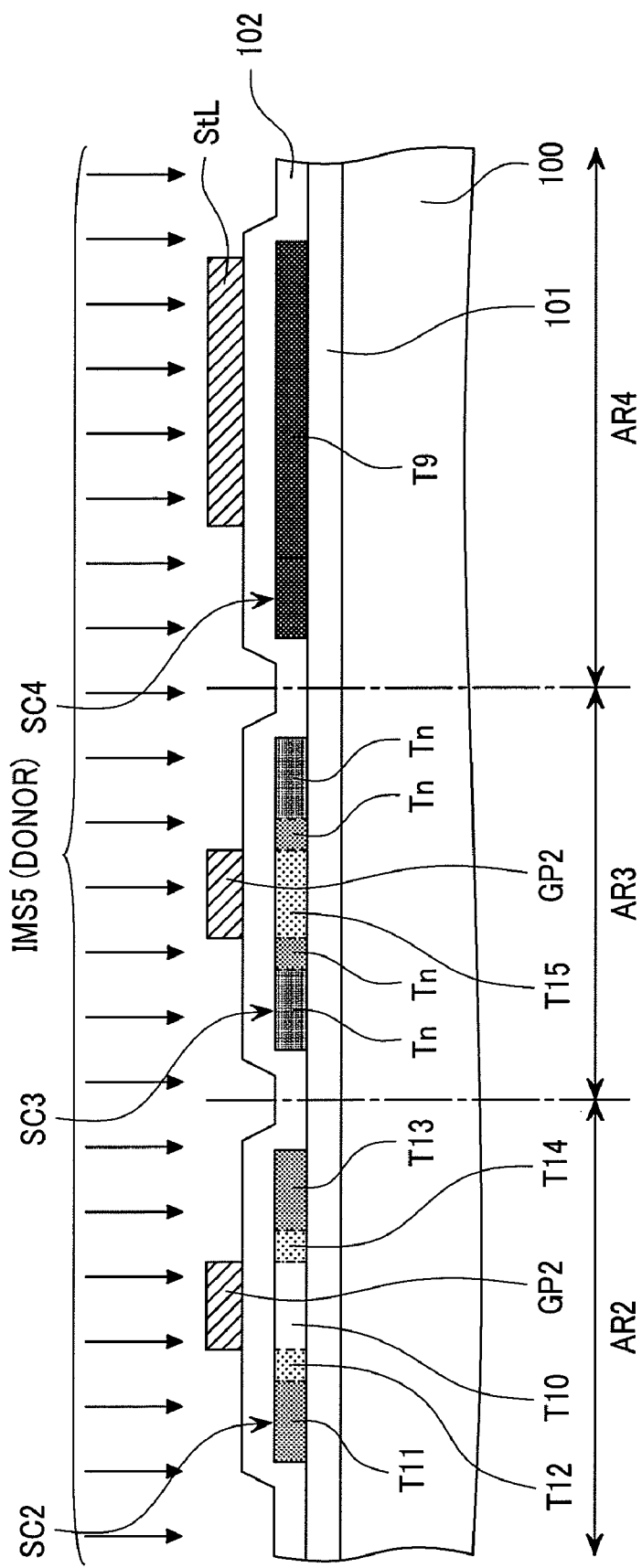
FIG. 13 is a schematic sectional view showing a second step in the step of forming an n-type region in the semiconductor layer in the region for forming an nMOS.

FIG. 13 is a schematic sectional view showing a second step in the step of forming an n-type region in the semiconductor layer in the region for forming an nMOS.

FIG. 14 is a schematic sectional view showing the step of forming a p-type region in the semiconductor layer in the region for forming a pMOS.

In the method of manufacturing the TFT substrate 1 according to the first embodiment, initially, the first insulating layer 101 is formed on a surface of the glass substrate 100, as shown in FIG. 6A. Then, the semiconductor layer SC2 of the nMOS, the semiconductor layer SC3 of the pMOS, and the semiconductor layer SC4 to be used as an electrode of the capacitor. The first insulating layer 101 is obtained, for example, by forming a silicon nitride film (SiN film) by chemical vapor deposition and then forming a silicon oxide film ($SiO_2$ film) on the silicon nitride film.

The semiconductor layers SC2, SC3, and SC4 are formed, for example, by forming amorphous silicon on the first insulating layer 101, making the amorphous silicon into a polycrystalline silicon film, and then etching the polycrystalline silicon film. To make the amorphous silicon film into a polycrystalline silicon film, it is sufficient, for example, to apply energy beam such as an excimer laser or a continuous-wave laser to the amorphous silicon film so as to dissolve the amorphous silicon film once and then to solidify (crystallize) the dissolved amorphous silicon film. When the amorphous silicon film is etched, the semiconductor layer SC2 and the semiconductor layer SC3 are formed, for example, in a pattern such that these semiconductor layers intersect a region GP2' for forming a gate electrode in a later step, as shown in FIG. 6B. If the capacitor is a holding capacitance of a pixel in the display area DA, the semiconductor layer SC4 of the region AR4 for forming the capacitor is preferably formed as a part of the pattern of the semiconductor layer SC1 of the active element, as shown in FIG. 6C.

Next, as shown in FIG. 7, the second insulating layer 102 is formed on the semiconductor layers SC2, SC3, and SC4. Then an impurity IMS1 (acceptor) is implanted to the semiconductor layers SC2, SC3, and SC4 via the second insulating layer 102 so as to make the semiconductor layers SC2, SC3, and SC4 into p-type semiconductors. The second insulating layer 102 is obtained, for example, by forming a silicon oxide film ($SiO_2$ film) by chemical vapor deposition. To make the semiconductor layers SC2, SC3, and SC4 into p-type semiconductors, for example, a boron ion (B+) as the acceptor is implanted to these semiconductor layers. At this time, an acceptor such as a boron ion is implanted to all regions of the semiconductor layers SC2, SC3, and SC4, whereby all regions of these semiconductor layers are made into p-type regions Tp. Thus, a channel implant for controlling the threshold of the nMOS is formed. Note that since it is sufficient to control the threshold in this step, a donor may be implanted as the first impurity IMS1 so as to make the semiconductor layers SC2, SC3, and SC4 into n-type semiconductors.

Next, as shown in FIG. 8A, a first resist 7A is formed so as to cover the region AR2 for forming an n-MOS and the region AR3 for forming a PMOS and to have an opening in the region AR4 for forming a capacitor. Then, a second impurity IMS2 (donor) is implanted to only the semiconductor layer SC4 of the region AR4 for a capacitor via the second insulating layer 102 so as to make the semiconductor layer SC4 into an n-type semiconductor. To make the semiconductor layer SC4 into an n-type semiconductor, for example, a phosphorus ion ($P^+$) is implanted as a donor. In this case, the semiconductor layer SC4, which has undergone acceptor implantation in the previous step so as to become a p-type region Tp, is made into a high concentration n-type region Tn by increasing the amount (dose) of the donor so that the concentration of the donor to be implanted in this step is sufficiently higher than that of the already implanted acceptor. This allows the semiconductor layer SC4 to become conductive. Note that since it is sufficient to make the semiconductor layer SC4 conductive in this step, an acceptor may be implanted as the second impurity IMS2 so as to make the semiconductor layer SC4 into a high concentration p-type semiconductor.

If the semiconductor layer SC4 is formed as a part of the pattern of the semiconductor layer SC1 of the active element disposed for a pixel in the display area DA, for example, the first resist 7A is provided with an opening so that the second impurity IMS2 is implanted to only the region SC4 serving as an electrode of the holding capacitance and the region SC4's vicinity, of the semiconductor layer SC1, as shown in FIG. 8B. While the region SC4 of the semiconductor layer SC1 appears to be exposed in FIG. 8B, it is covered with the second insulating layer 102 in practice.

The first resist 7A is formed, for example, by applying a photosensitive resist onto the second insulating layer 102 so as to be approximately uniform in thickness, exposing the resist using a technique called half exposure or halftone exposure, and then developing and baking the resist. If the photosensitive resist is negative, the region AR3 and the region AR4 are irradiated with light (e.g., an ultraviolet ray) via an exposure mask so as to be exposed. If the photosensitive resist is exposed using half exposure, for example, an exposure mask designed so that the light transmittance of a location through which light to be applied to the region AR3 passes is lower than that of a location through which light to be applied to the region AR4 passes is used. If exposure of the photosensitive resist on the region AR4 ends in the minimum time required to expose it completely, exposure of the photosensitive resist on the region AR3 ends in an incomplete manner. As a result, a soluble portion and an insoluble portion to a developer occur in the photosensitive resist on the region AR3. Thus, developing these photosensitive resists allows formation of the first resist 7A whose thickness is smaller in the region AR3 than in the region AR2.

Next, for example, the first resist 7A undergoes ashing so as to become thinner as a whole by the thickness of the first resist 7A in the region AR3. Thus, a second resist 7B is formed in such a manner that it covers the region AR2 and has openings in the region AR3 and the region AR4, as shown in FIGS. 9A and 9B. While the semiconductor layer SC3 appears to be exposed in FIG. 9B, it is covered with the second insulating layer 102 in practice. Then, a third impurity IMS3 (donor) is implanted to the semiconductor layers SC3 and SC4 via the second insulating layer 102 so as to make the semiconductor layer SC3 into an n-type semiconductor. To make the semiconductor layer SC3 into an n-type semiconductor, for example, a phosphorus ion ($P^+$) is implanted as a donor. The semiconductor layer SC3, which has also undergone acceptor implantation in the previous step so as to become a p-type region Tp, is made into an n-type region Tn by increasing the amount (dose) of the donor so that the concentration of the donor to be implanted in this step is higher than that of the already implanted acceptor. This allows formation of a channel implant for controlling the threshold of the pMOS. Note that since it is sufficient to be able to control the threshold in this step, an acceptor may be implanted as the third impurity IMS3. That is, the semiconductor layer 3 may be a p-type semiconductor. Which of an acceptor and a donor is to be implanted, the concentration of an acceptor or donor to be implanted, or the like may be set up arbitrarily.

While this step is a step that is performed to form the channel region (n-type region T15) of the semiconductor layer SC3 of the pMOS in a later step, the donor is also implanted to the semiconductor layer SC4 of the region AR4. However, the semiconductor layer SC4 has already become the n-type region Tn, so the donor concentration of the semiconductor layer SC4 simply increases.

Then, the second resist 7B is eliminated. Thus, all regions of the semiconductor layer SC2 are made into a p-type region Tp, all regions of the semiconductor layer SC3 are made into an n-type region Tn, and all regions of the semiconductor layer SC4 are made into an n-type region Tn whose concentration is higher than that of the semiconductor layer SC3, as shown in FIG. 10.

In the steps up to here, the two resists, that is, the first and second resists 7A and 7B have been formed on the second insulating layer 102 for the purpose of ion-implanting the first, second, and third impurities IMS1, IMS2, and IMS3. However, it is sufficient for only the first resist 7A to be formed by exposing, developing, and baking a photosensitive resist because the second resist 7B is formed by thinning the first resist 7A by ashing or the like.

In the first embodiment, first, the semiconductor layers SC2, SC3, and SC4 are made into p-type semiconductors, and then the semiconductor layer SC3 in the region AR3 for forming a pMOS and the semiconductor layer SC4 in the region AR4 for forming a capacitor are made into n-type semiconductors. However, in the manufacturing method according to the first embodiment, it is sufficient for the semiconductor layer SC2 to have been made into a p-type semiconductor, for the semiconductor layer SC3 to have been made into an n-type semiconductor, and for the semiconductor layer SC4 to have been made into an n-type semiconductor whose concentration is higher than that of the semiconductor layer SC3 in the steps up to here. Therefore, instead of implanting the first impurity IMS1 to the semiconductor layers SC2, SC3, and SC4 prior to forming the first resist 7A, for example, the SC3 and SC4 may initially be made into n-type semiconductors using the first and second resists 7A and 7B, and then the resist 7B may be eliminated and the first impurity IMS1 (acceptor) may be implanted to the semiconductor layers SC2, SC3, and SC4 in the state shown in FIG. 10.

After having made the semiconductor layer SC2 into a p-type semiconductor, the semiconductor layer SC3 into an n-type semiconductor, and the semiconductor layer SC4 into an n-type semiconductor whose concentration is higher than that of the semiconductor layer SC3 using the above-described procedure, a gate electrode and another electrode of the capacitor are formed and impurities are ion-implanted to the source and drain regions of the semiconductor layers SC2 and SC3 so as to form an nMOS and a pMOS.

To form a gate electrode and another of the capacitor, first, a conductive film 8 is formed on the second insulating layer 102 and then an etching resist 9 is formed on the conductive film 8, as shown in FIG. 11. The conductive film 8 is obtained, for example, by forming an aluminum film or an alloy film of molybdenum and tungsten by sputtering. The etching resist 9 is formed, for example, by applying a photosensitive resist onto the conductive film 8 and then exposing, developing, and baking the photosensitive resist. In the manufacturing method according to the first embodiment, the conductive film 8 is etched using isotropic etching, so the etching resist 9 is desirably formed so as to be larger in size than the patterns of a gate electrode and an electrode of the capacitor to be formed actually.

Next, as shown in FIG. 12, the conductive film 8 is etched using the etching resist 9 as a mask so as to form gate electrodes GP2 of the nMOS and pMOS and the upper electrode of the capacitor (holding capacitance line StL). Then, for example, a fourth impurity IMS4 (donor) is implanted to the semiconductors SC2 and SC3 via the second insulating layer 102 while leaving the etching resist 9 intact.

This step is a first step in the step of making the source and drain regions of the semiconductor layer SC2 into high concentration n-type regions T11 and T13 and low concentration n-type regions T12 and T14. Therefore, the amount of a donor to be implanted to the semiconductor layer SC2 in this step is set up such that the concentration of the donor is higher than that of the acceptor already implanted to the semiconductor layer SC2.

While the donor is also implanted to the source and drain regions of the semiconductor layer SC3 of the pMOS in this step, these regions may be n-type semiconductors at the end of this step because an acceptor will be implanted to these regions in a later step so as to make them into p-type semiconductors. Further, while the donor is implanted to a part of the semiconductor layer SC4, it is no problem that the semiconductor layer SC4 undergoes such donor implantation because the semiconductor layer SC4 has already become a high concentration n-type region Tn.

Next, the etching resist 9 is eliminated, and then, as shown in FIG. 13, a fifth impurity IMS5 (donor) is implanted to the semiconductor layers SC2 and SC3 via the second insulating layer 102 using the gate electrodes and upper electrode (holding capacitance line StL) as masks.

This step is a second step in the step of making the source and drain regions of the semiconductor layer SC2 into high concentration n-type regions T11 and T13 and low n-type concentration regions T12 and T14. Therefore, the amount of a donor to be implanted to the semiconductor layer SC2 in this step is set up such that the concentration of the donor is higher than that of the acceptor already implanted to the semiconductor layer SC2. Since the high concentration n-type regions T11 and T13 have already become n-type regions in the previous step, the donor concentration of these regions becomes higher than that of the low n-type concentration regions T12 and T14 accordingly in this step.

While the donor is also implanted to the source and drain regions of the semiconductor layer SC3 of the pMOS in this step, these regions may be n-type region Tn at the end of this step because an acceptor will be implanted to these regions in a later step so as to make them into p-type semiconductors. Further, while the donor is also implanted to a part of the semiconductor layer SC4 in this step, it is no problem that the semiconductor layer SC4 undergoes such donor implantation because the semiconductor layer SC4 has already become a high concentration n-type region Tn (T9).

Next, as shown in FIG. 14, a third resist 7C is formed so as to cover the regions AR2 and AR4 and have an opening in the region AR3. Then, a sixth impurity IMS6 (acceptor) is implanted only to the source region R16 and drain region 17 of the semiconductor layer SC3 so as to make these regions into p-type regions.

This step is intended to make the source region R16 and drain region 17 of the semiconductor layer SC3 into p-type regions Tp. The source region R16 and drain region 17, which have undergone donor implantation in the previous step so as to become n-type regions Tn, are restored to p-type regions if the amount (dose) of an acceptor to be implanted to these regions in this step is increased so that the concentration of the acceptor becomes sufficiently higher than that of the donor already implanted to these regions.

Next, the third resist 7C is eliminated, and then the third insulating layer 103 is formed, a through hole is formed in the third insulating film 103, a conductive film is formed on the third insulating layer 103, and the conductive film is etched so as to form metal wiring, a video signal line, a source electrode, and the like. Thus, an nMOS, a PMOS, and a capacitor are formed, as shown in FIG. 5. Concurrently, a switching element (nMOS) of the display area DA is also formed.

Figure 15B:
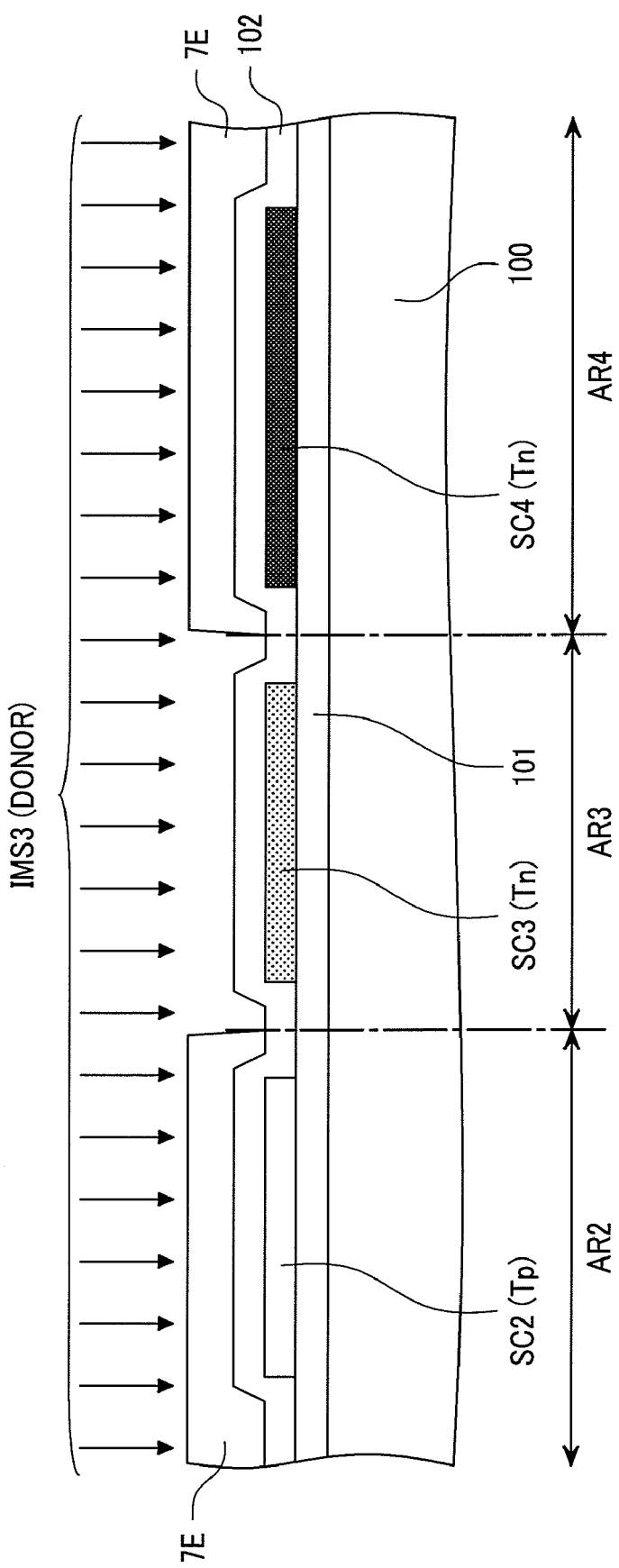
FIG. 15B is a schematic sectional view showing an example of a step of implanting an impurity to a semiconductor layer in a region for forming a pMOS using the related art method.

FIGS. 15A and 15B are schematic sectional views showing an example of a procedure conceivable if one p-type semiconductor and two n-type semiconductors that are different in donor concentration are formed using a related art method, for the purpose of comparing with the manufacturing method according to the first embodiment.

FIG. 15A is a schematic sectional view showing an example of the step of implanting an impurity to a semiconductor layer in a region for forming a capacitor using a related art method. FIG. 15B is a schematic sectional view showing an example of the step of implanting an impurity to a semiconductor layer in a region for forming a pMOS using the related art method.

Now simple description will be made on a procedure for implanting an impurity conceivable if the related art method is used to make the semiconductor layer SC2 in the region AR2 for forming an nMOS into a p-type semiconductor, the semiconductor layer SC3 in the region AR3 for forming a pMOS into an n-type semiconductor, and the semiconductor layer SC4 in the region AR4 for forming a capacitor into an n-type semiconductor whose concentration is higher than that of the semiconductor layer SC3.

If the method described in Japanese Patent Application Laid-Open Publication No. 2003-282880 or Japanese Patent Application Laid-Open Publication No. 2005-274984 is applied as a comparative example, it is conceivable to initially implant the first impurity IMS1 (acceptor) to the semiconductor layer SC2 in the region AR2 for forming an nMOS, semiconductor layer SC3 in the region AR3 for forming a pMOS, and semiconductor layer SC4 in the region AR4 for forming a capacitor so as to make the semiconductors SC2, SC3, and SC4 into p-type semiconductors, as shown in FIG. 7. In this case, impurities (donors) must be implanted to the semiconductor layers SC3 and SC4 in a later step so as to change these semiconductor layers' conductivity type from p-type to n-type.

However, if the method described in Japanese Patent Application Laid-Open Publication No. 2003-282880 or Japanese Patent Application Laid-Open Publication No. 2005-274984 is applied, it is conceivable that the procedure for changing the conductivity type of the semiconductor layers SC3 and SC4 from p-type to n-type is as follows.

First, as shown in FIG. 15A, a resist 7D is formed so as to cover the regions AR2 and AR3 and have an opening in the region AR4. Then, the second impurity IMS2 (donor) is implanted to only the semiconductor layer SC4 so as to make the entire semiconductor layer SC4 from an p-type region to an n-type region Tn.

Next, the resist 7D is eliminated, and then, for example, another resist 7E is formed so as to cover the regions AR2 and AR4 and have an opening in the region AR3, as shown in FIG. 15B. Then, the third impurity IMS3 (donor) is implanted to only the semiconductor layer SC3 so as to change the entire semiconductor layer SC3 from an p-type region Tp to an n-type region Tn. Incidentally, it is also conceivable to form a resist in this step so as to cover the region AR2 and have openings in the regions AR3 and AR4. In this case, the donor concentration of the semiconductor layer SC4 is increased at the same time that an impurity (donor) is implanted to the semiconductor layer SC3 so as to change the semiconductor layer SC3 from p-type to n-type.

In the above-mentioned comparative example, the resists 7D and 7E are each formed by applying, exposing via an exposure mask, and developing a photosensitive resist. Therefore, two masks, that is, one to be used to form the resist 7D and another to be used to form the resist 7E are required.

On the other hand, in the method according to the first embodiment, the second resist 7B is formed by thinning the first resist 7A by ashing or the like, so it is sufficient for only the first resist 7A to be formed by applying, exposing via an exposure mask, and developing a photosensitive resist. This allows the number of exposure masks to be reduced to one, thereby reducing the cost for manufacturing exposure masks. This also allows a reduction in the frequency of the processes such as application, exposure, and development of a photosensitive resist. As a result, the cost and time for manufacturing the TFT substrate 1 (liquid crystal display panel) are reduced.

Incidentally, in the first embodiment, a photosensitive resist is halftone-exposed at the formation of the first resist 7A so that the region AR3 is smaller in thickness than the region AR2, as shown in FIG. 8A. However, without being limited to this, a photosensitive resist may be halftone-exposed so that the region AR2 is smaller in thickness than the region AR3.

Second Embodiment

Figure 16:
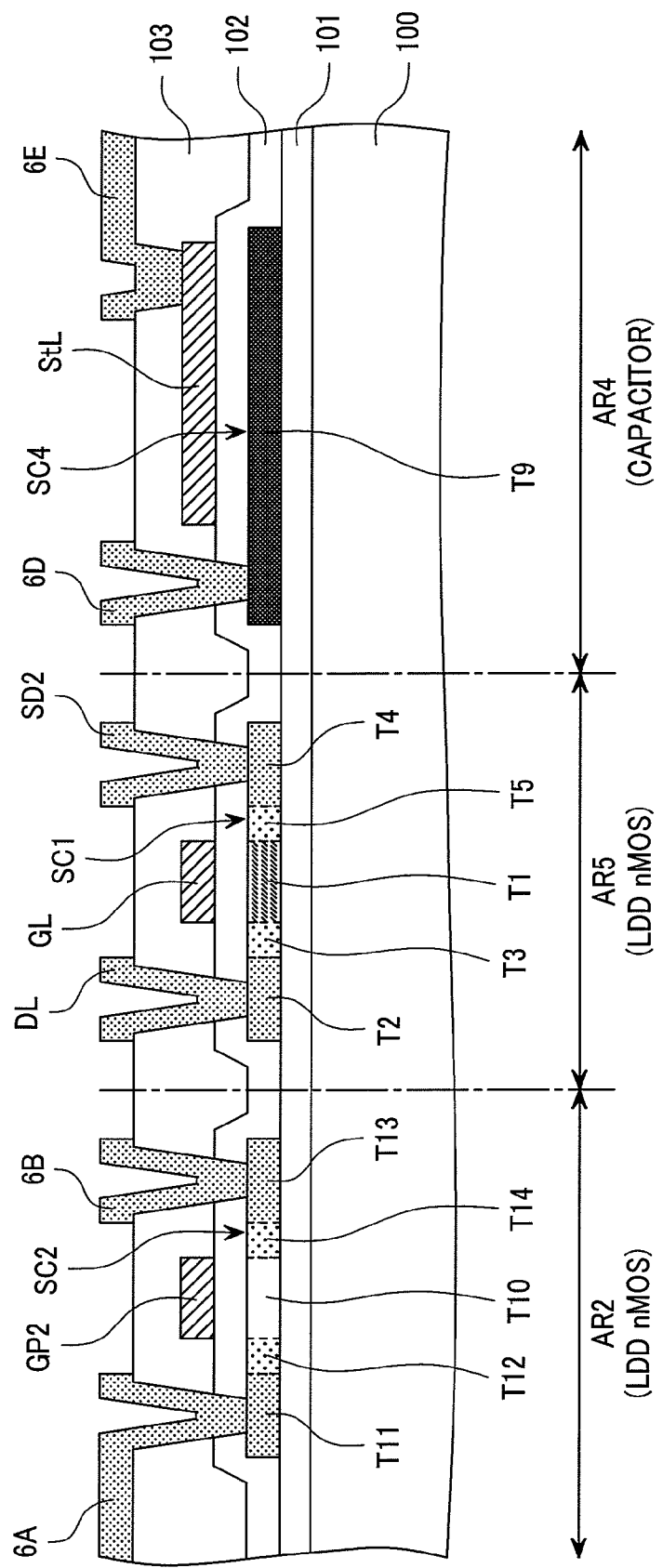
FIG. 16 is sectional view showing the configuration of MOS transistors and a capacitor formed using a manufacturing method according to a second embodiment of the present invention.

FIG. 16 is a schematic sectional view showing the configuration of MOS transistors and a capacitor formed using a manufacturing method according to a second embodiment of the present invention.

A method of manufacturing a TFT substrate 1 according to the second embodiment will now be described using a case in which two types of nMOS that have different carrier concentrations and a capacitor that uses a high concentration n-type semiconductor layer as an electrode are formed above the glass substrate 100, as shown in FIG. 16.

The sectional configuration of a region AR4 for forming a capacitor shown in FIG. 16 is similar to that shown in the first embodiment (FIG. 5) and conceptually shows a portion related to the present invention, of the sectional configuration taken along line C-C' of FIG. 3A. Therefore, the configuration of the capacitor shown FIG. 16 will not be described.

The sectional configuration of a region AR2 for forming a first nMOS shown in FIG. 16 is that taken along line D-D' of FIG. 4A. The sectional configuration of a region AR5 for forming a second nMOS shown in FIG. 16 conceptually shows a portion related to the present invention, of the sectional configuration taken along line B-B' of FIG. 3B. In other words, the first nMOS is, for example, an nMOS to be used in a first drive circuit DRV1 or a second drive circuit DRV2. The second nMOS is, for example, an active element to be arranged in a matrix in a display area DA. Therefore, the configurations of the first and second nMOSs will not be described.

The first and second nMOSs both have an LDD structure. They are similar in basis configuration (structure) but are different in the microscopic configuration (crystallinity) of polycrystalline silicon used to form each semiconductor layer. The first nMOS is required to operate at a high speed compared with the second nMOS. Therefore, a semiconductor layer SC2 of the first nMOS is preferably made of polycrystalline silicon that is the aggregate of zonal crystals extending in an elongated manner in the movement direction of a carrier. On the other hand, a semiconductor layer SC1 of the second nMOS may be made of polycrystalline silicon or amorphous silicon that is the aggregate of microcrystals or granular crystals and have many grain boundaries.

However, for example, a difference in crystallinity of polycrystalline silicon between the semiconductor layers SC2 and SC1 leads to a difference in carrier mobility between these semiconductor layers, thereby resulting in a difference in optimum value, such as threshold value, between these semiconductor layers. Therefore, in order to make a channel region T10 of the semiconductor layer SC2 and a channel region T1 of the semiconductor layer SC1 into p-type semiconductors, different concentrations of an acceptor must be implanted to these channel regions T10 and T1. The channel regions T10 and T11 may be made into n-type semiconductors. In this case, different concentrations of a donor must be implanted to these channel regions T10 and T1.

A procedure for forming the first nMOS, the second nMOS, and the capacitor each having the configurations shown in FIG. 16 will be described below.

FIGS. 17 to 25 are schematic diagrams showing an example of the TFT substrate manufacturing method according to the second embodiment.

Figure 17:
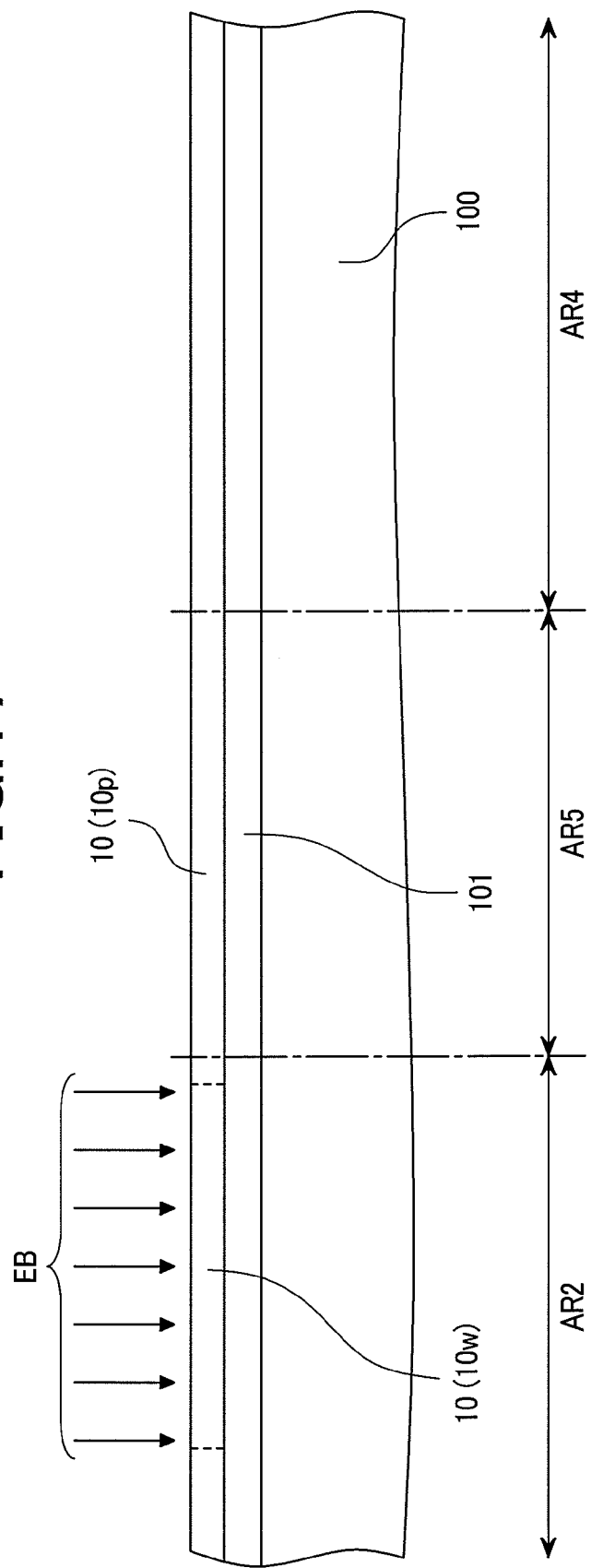
FIG. 17 is a schematic sectional view showing a step of forming a polycrystalline silicon film.

FIG. 17 is a schematic sectional view showing the step of forming a polycrystalline silicon film.

Figure 18:
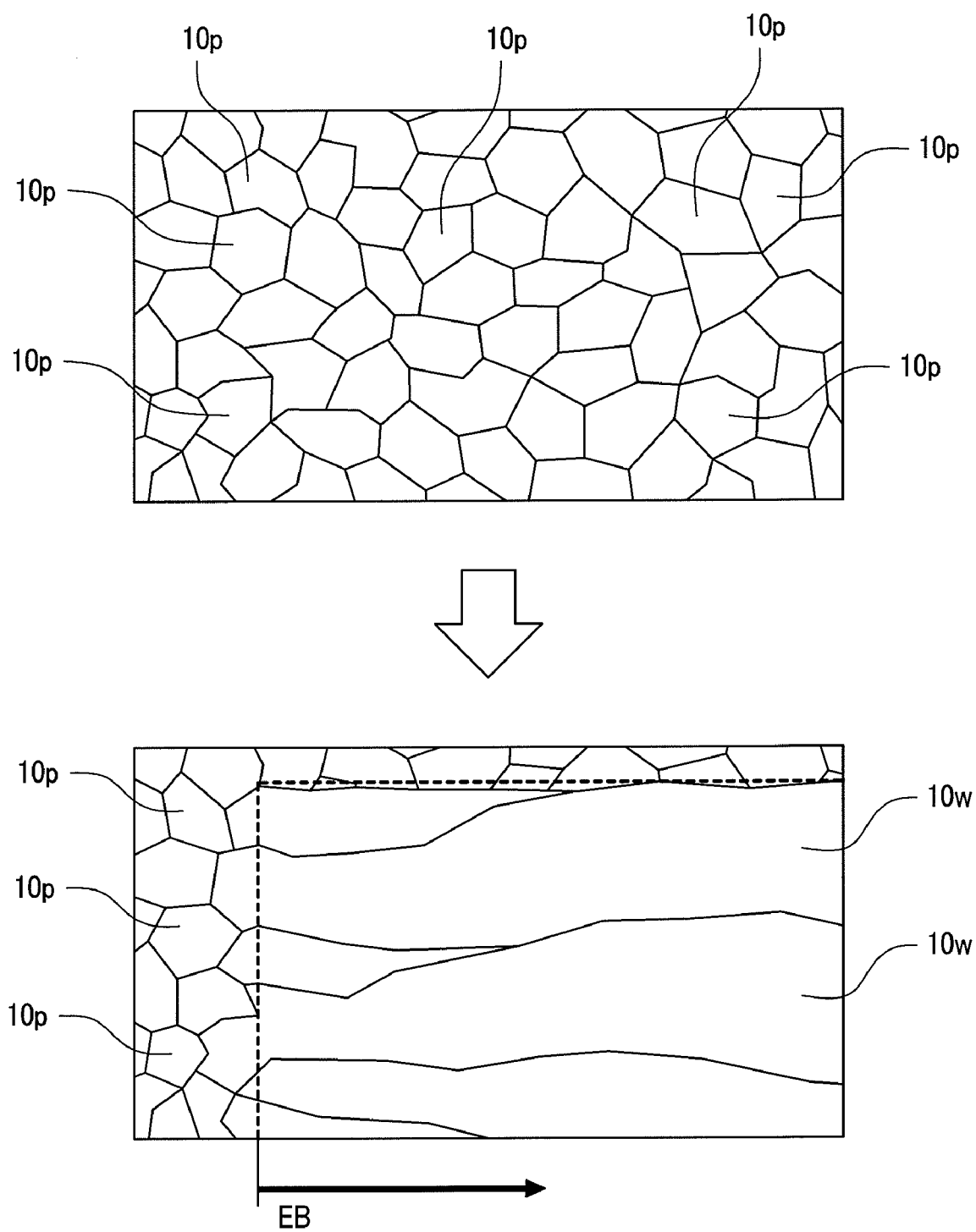
FIG. 18 is a schematic sectional view showing a difference in crystallinity between the semiconductor layer of a first nMOS and the semiconductor layer of a second nMOS.

FIG. 18 is a schematic sectional view showing a difference in crystallinity between the semiconductor layer of the first nMOS and the semiconductor layer of the second nMOS.

Figure 19:
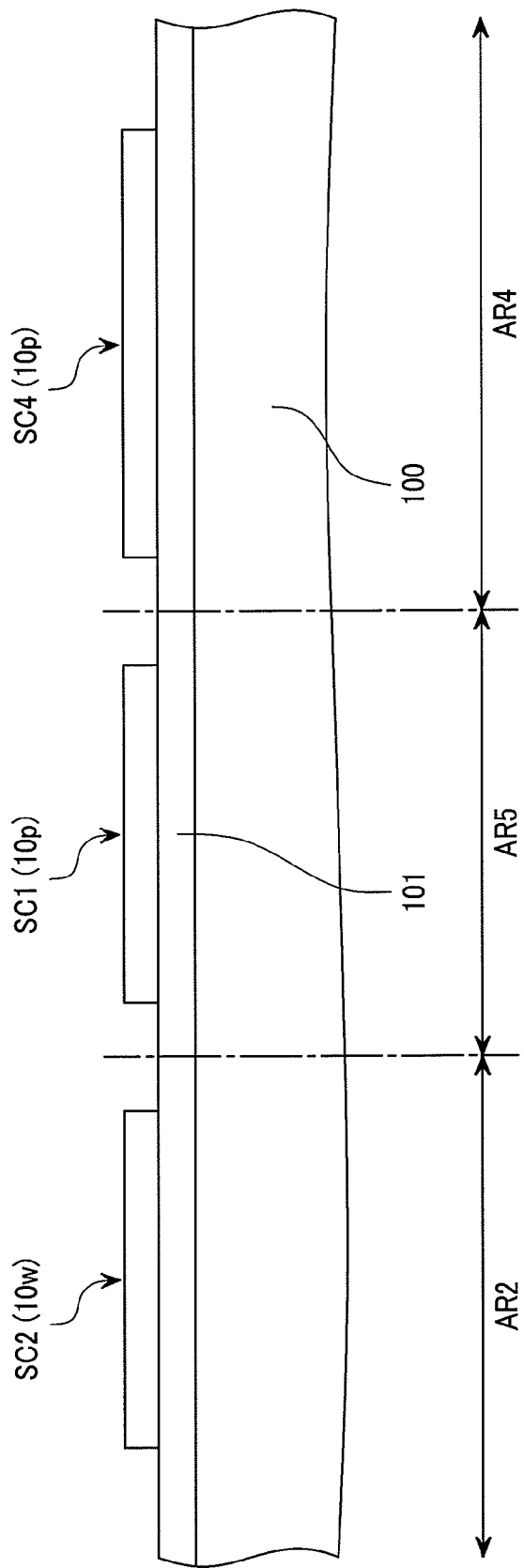
FIG. 19 is schematic plan view showing the state immediately after the polycrystalline silicon film has been etched.

FIG. 19 is schematic plan view showing the state immediately after a polycrystalline silicon film has been etched.

Figure 20:
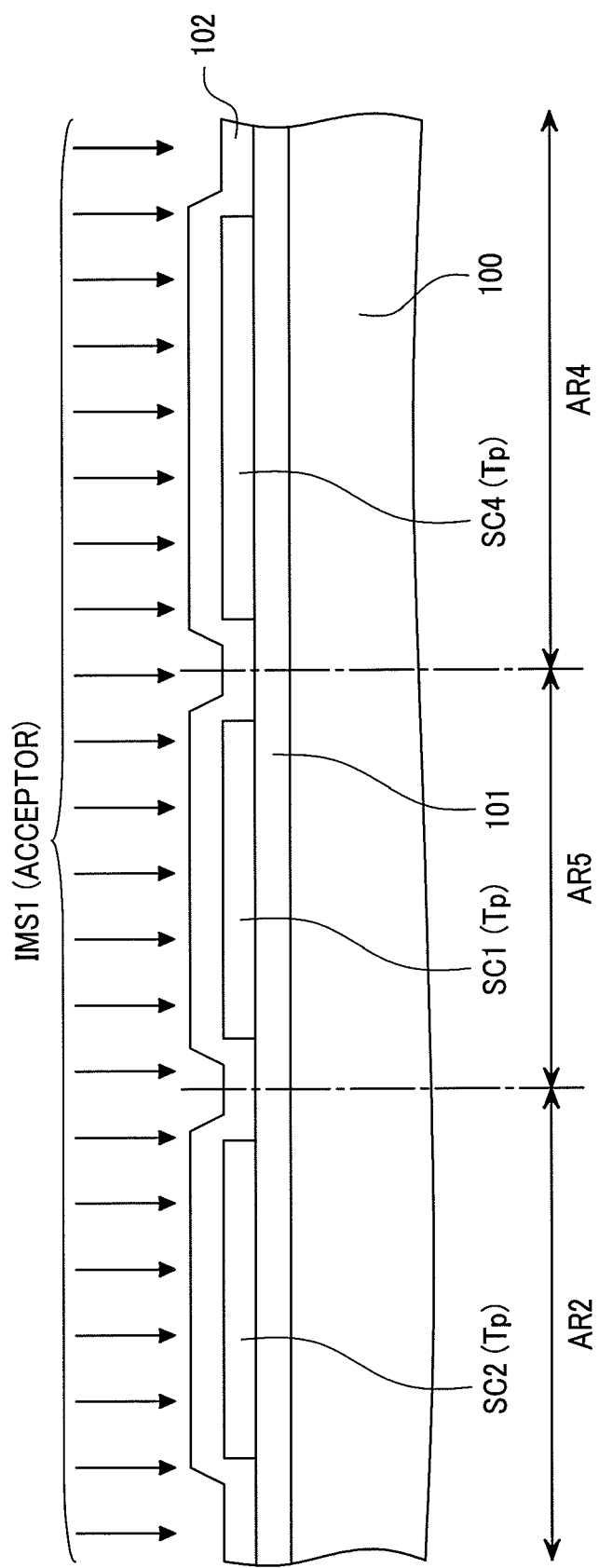
FIG. 20 is a schematic sectional view showing a step of making the semiconductor layers in the three regions p-type semiconductors.

FIG. 20 is a schematic sectional view showing the step of making the semiconductor layers in the three regions into p-type semiconductors.

Figure 21:
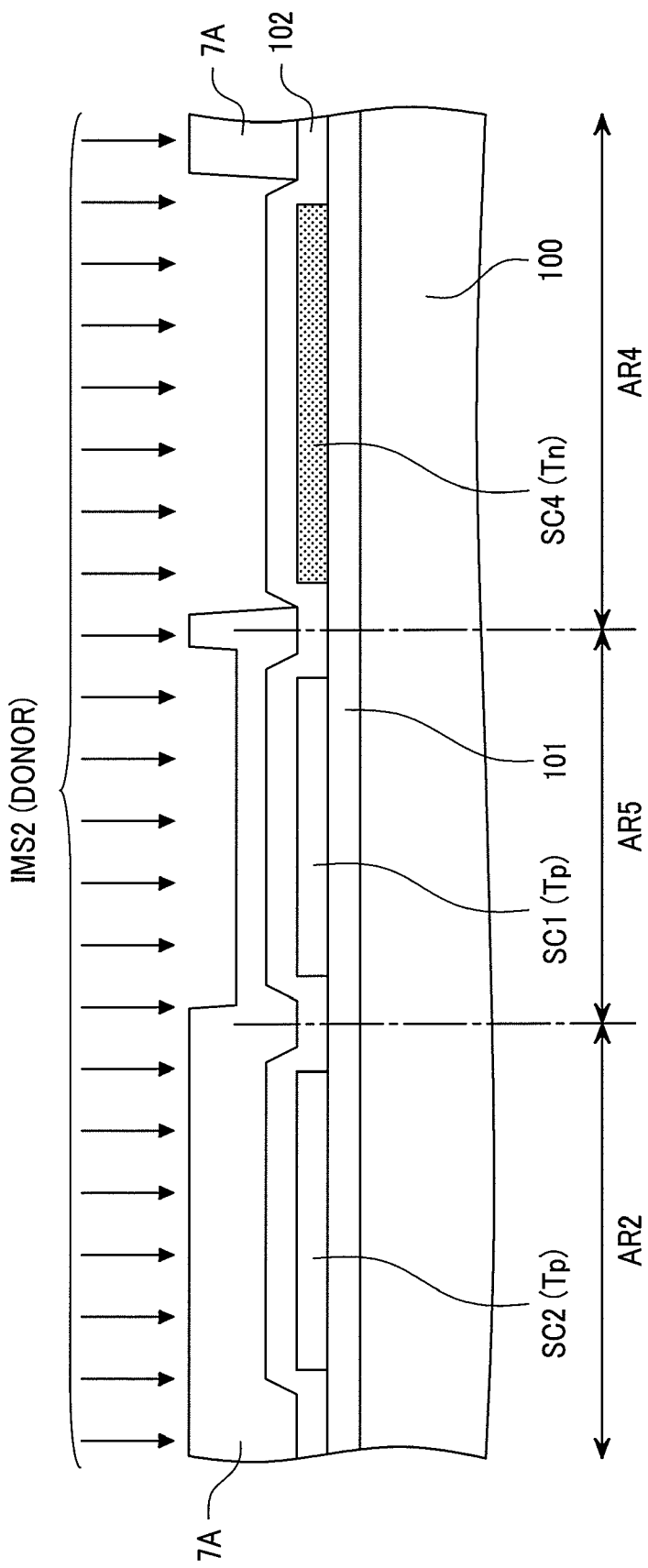
FIG. 21 is a schematic sectional view showing a step of changing the semiconductor layer in the region for forming a capacitor from a p-type semiconductor to an n-type one.

FIG. 21 is a schematic sectional view showing the step of changing the semiconductor layer in the region for forming a capacitor from p-type semiconductor to n-type semiconductor.

Figure 22:
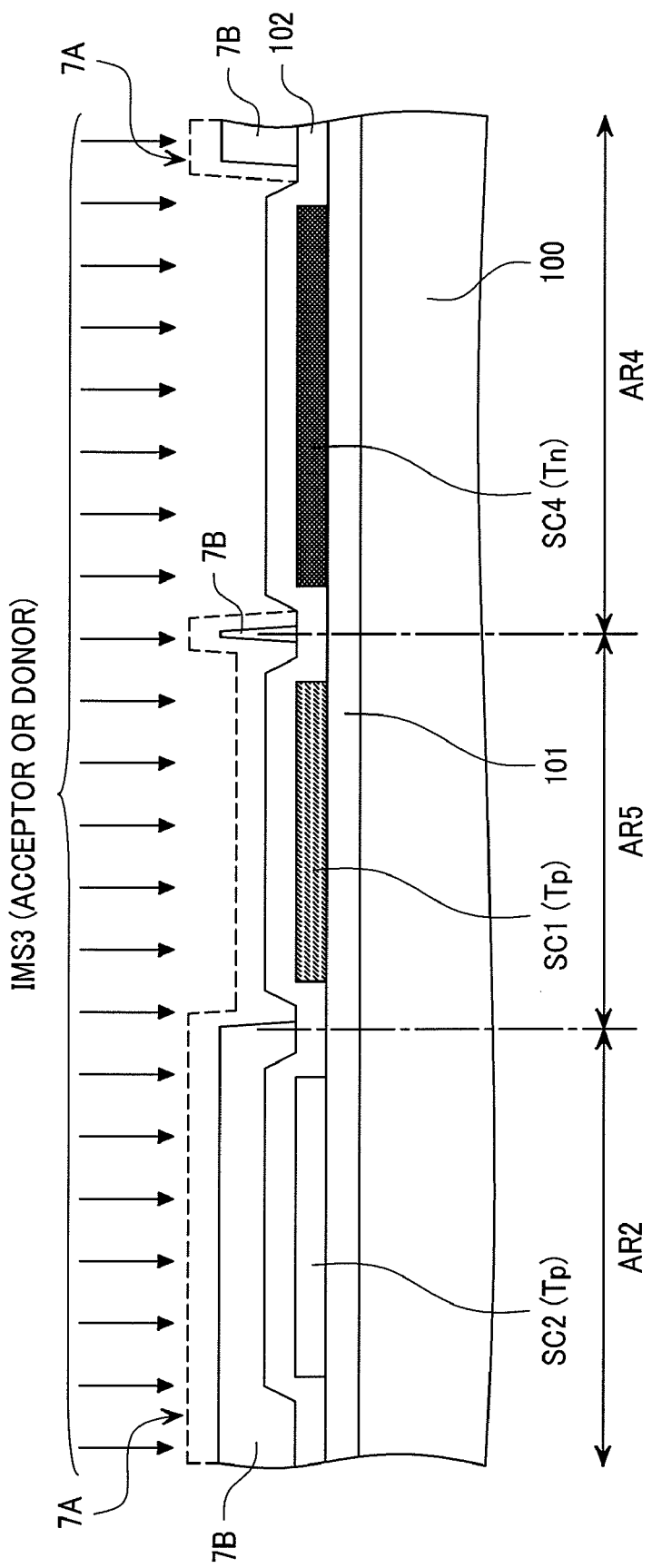
FIG. 22 is a schematic plan view showing a step of changing the carrier concentrations of the semiconductor layer in the region for forming the first nMOS and the semiconductor layer in the region for forming the second nMOS.

FIG. 22 is a schematic plan view showing the step of changing the carrier concentrations of the semiconductor layer in the region for forming the first nMOS and the semiconductor layer in the region for forming the second nMOS.

Figure 23:
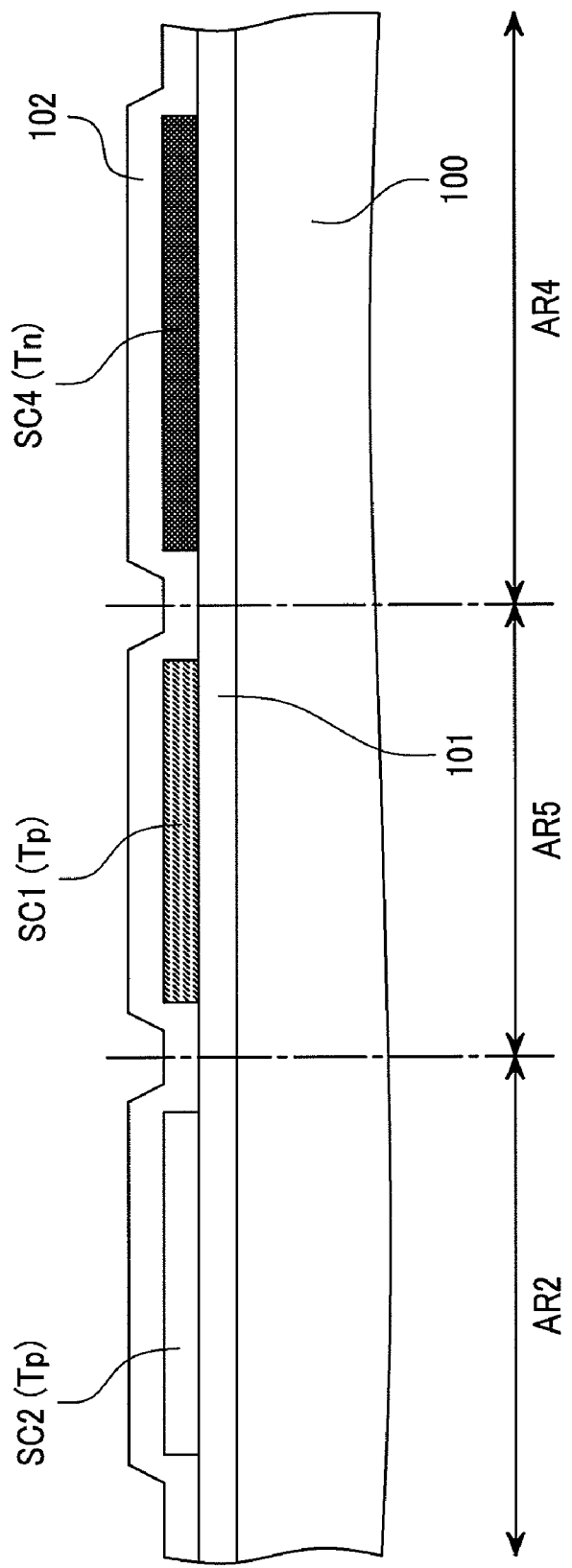
FIG. 23 is a schematic sectional view showing the state immediately after the second resist has been eliminated.

FIG. 23 is a schematic sectional view showing the state immediately after a second resist has been eliminated.

Figure 24:
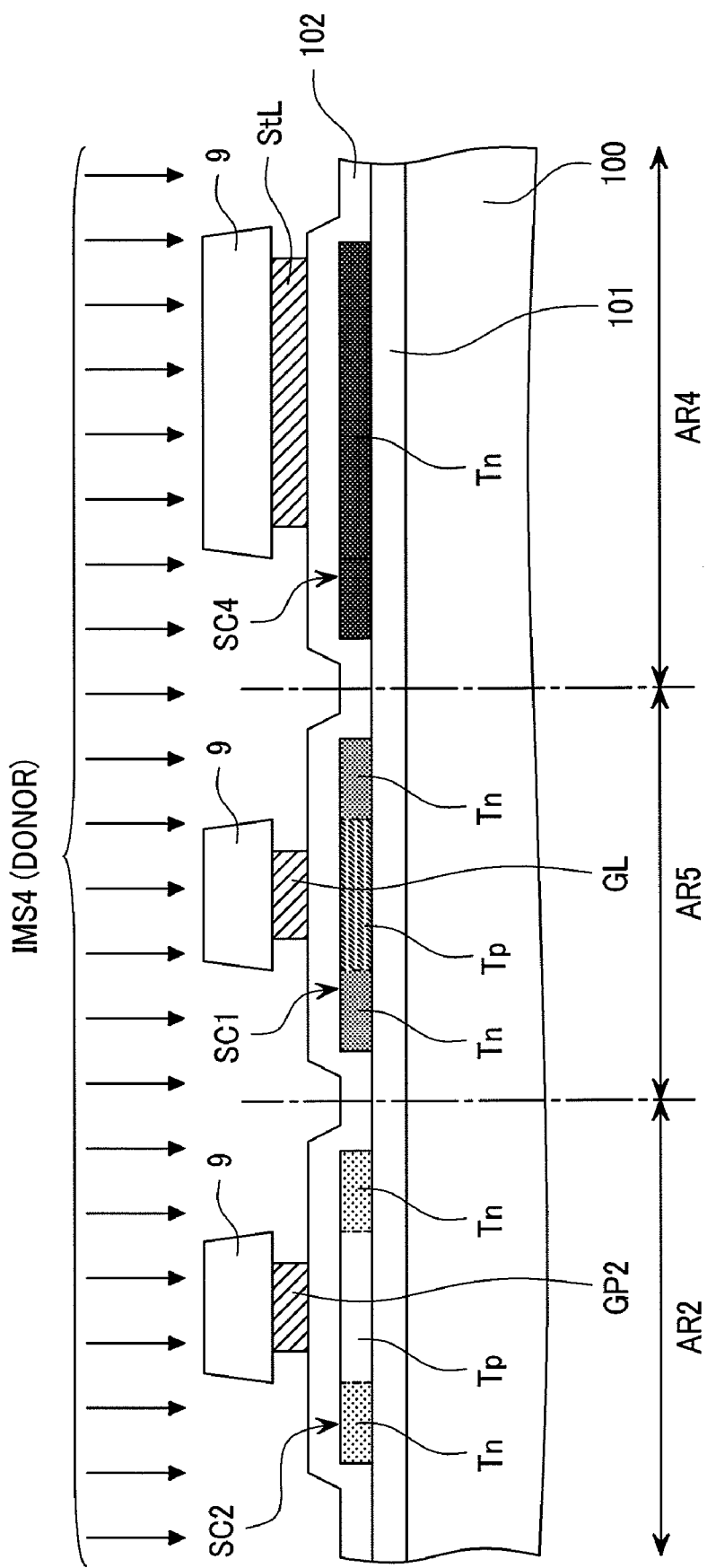
FIG. 24 is a schematic plan view showing a first step in a step of forming n-type regions in the semiconductor layer in the region forming the first nMOS and the semiconductor layer in the region forming the second nMOS.

FIG. 24 is a schematic plan view showing a first step in the step of forming n-type regions in the semiconductor layer in the region forming the first nMOS and the semiconductor layer in the region forming the second nMOS.

Figure 25:
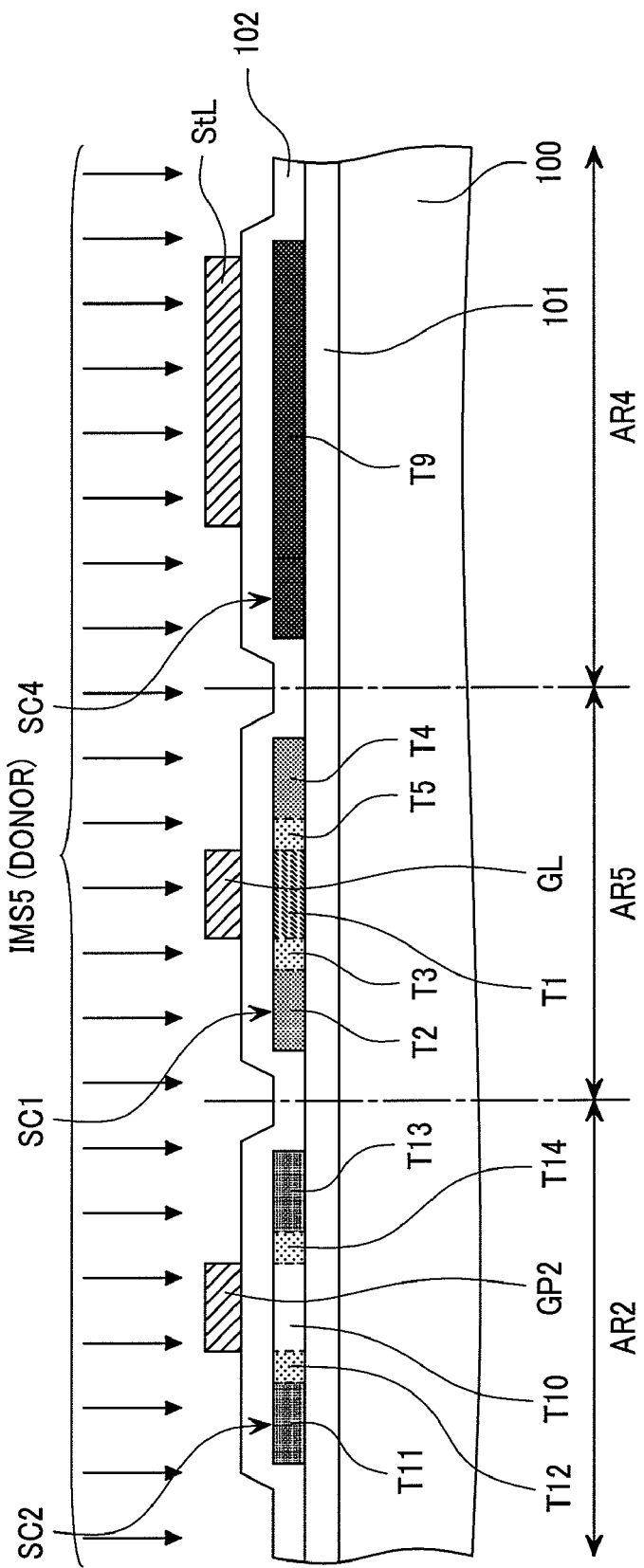
FIG. 25 is a schematic sectional view showing a second step in a step of forming n-type regions in the semiconductor layer in the region forming the first nMOS and the semiconductor layer in the region forming the second nMOS.

FIG. 25 is a schematic sectional view showing a second step in the step of forming n-type regions in the semiconductor layer in the region forming the first nMOS and the semiconductor layer in the region forming the second nMOS.

In the manufacturing method of a TFT substrate 1 according to the second embodiment, first, a first insulating layer 101 is formed on a surface of a glass substrate 100, as shown in FIG. 17. Subsequently, a polycrystalline silicon film 10 is formed on the first insulating layer 101. The first insulating layer 101 is, for example, a two-layer insulating film obtained by forming a silicon nitride film and a silicon oxide film by chemical vapor deposition.

The polycrystalline silicon film 10 is obtained, for example, by first forming an amorphous silicon film on the first insulating layer 101, applying an energy beam, such as an excimer laser, to the amorphous silicon film so as to dissolve the amorphous silicon once, and then solidifying (crystallizing) the dissolved amorphous silicon film. The crystallinity (microscopic configuration) of the polycrystalline silicon film 10 obtained in this manner varies according to the energy density of the applied energy beam, the beam's application time, or the like. In general, the polycrystalline silicon film 10 is the aggregate of minute crystals 10$p$ called as microcrystals or granular crystals and has many grain boundaries, as shown in the upper portion of FIG. 18. Therefore, if the semiconductor layer (channel region) of the nMOS is made of the polycrystalline silicon film 10 as described above, the carrier mobility is reduced due to the grain boundaries, thereby making it difficult for the nMOS to operate at a high speed.

However, an nMOS of a drive circuit outside the display area DA, such as the first nMOS, is required to operate at a high speed compared with an active element of the display area DA. Therefore, it is desirable to, after having formed the polycrystalline silicon film 10 that is the aggregate of the minute crystals 10$p$ as shown in the upper portion of FIG. 18, apply a different energy beam EB, such as an excimer laser or a continuous-wave laser, to the region AR2 for forming the first nMOS so as to reduce the grain boundaries, as shown in FIG. 17. At this time, the energy beam EB is applied while shifting the application position on the glass substrate 100 in one direction, so that the silicon that has dissolved due to the application of the energy beam EB is re-crystallized. Also, if the energy density and application time of the energy beam EB are set to particular values, the dissolved silicon achieves super lateral growth at its re-crystallization. For example, polycrystalline silicon that is the aggregate of zonal crystals 10$w$ extending in an elongated manner in the direction (scan direction) in which the application position of the energy beam EB is shifted is obtained, as shown in the lower portion of FIG. 18.

Next, as shown in FIG. 19, the polycrystalline silicon film 10 is etched to form the semiconductor layer SC2 in the region AR2 for forming the first nMOS, the semiconductor layer SC1 in the region AR5 for forming the second nMOS, and the semiconductor layer SC4 in the region AR4 for forming a capacitor. If the capacitor is the holding capacitance of a pixel in the display area DA, the semiconductor layer SC4 is preferably formed as a part of the pattern of the semiconductor layer SC1, as shown in FIG. 6C.

Next, as shown in FIG. 20, a second insulating layer 102 is formed on a surface of the first insulating layer 101 on which the semiconductor layers SC2, SC1, and SC4 are formed, and then an first impurity IMS1 (acceptor) is implanted to these semiconductor layers SC2, SC1, and SC4 via the second insulating layer 102 so as to make these semiconductor layers SC2, SC1, and SC4 into p-type semiconductors. The second insulating layer 102 is obtained, for example, by forming a silicon oxide film by chemical vapor deposition. To make the semiconductor layers SC2, SC3, and SC4 into p-type semiconductors, for example, a boron ion (B+) as the acceptor is implanted to these semiconductor layers SC2, SC1, and SC4. At this time, an acceptor such as a boron ion is implanted to all regions of the semiconductor layers SC2, SC1, and SC4, thereby making all regions of these semiconductor layers SC2, SC1, and SC4 into p-type regions Tp. Thus, a channel implant for controlling the threshold of the nMOS is formed. Note that since it is sufficient to be able to control the threshold in this step, a donor may be implanted to the semiconductor layers SC2, SC3, and SC4 as the first impurity IMS1 so as to make these semiconductor layers SC2, SC1, and SC4 into n-type semiconductors.

Next, as shown in FIG. 21, a resist 7D is formed so as to cover the region AR2 and the region AR5 and have an opening in the region AR4. Then, a second impurity IMS2 (donor) is implanted to only the semiconductor layer SC4 via the second insulating layer 102 so as to make the semiconductor layer SC4 into an n-type semiconductor. To make the semiconductor layer SC4 into an n-type semiconductor layer, for example, a phosphorus ion ($P^+$) is implanted to the semiconductor layer SC4 as a donor. In this case, the semiconductor layer SC4, which has undergone acceptor implantation in the previous step so as to become a p-type region Tp, is made into an n-type region Tn by increasing the amount (dose) of a donor to be implanted in this step so that the concentration of the donor is higher than that of the already implanted acceptor. This allows the semiconductor layer SC4 to become conductive. Note that since it is sufficient for the semiconductor layer SC4 to be rendered conductive in this step, an acceptor may be implanted as the second impurity IMS2 so that the semiconductor layer SC4 is made into a high concentration p-type semiconductor.

If the semiconductor layer SC4 is formed as a part of the pattern of the semiconductor layer SC1 of the active element disposed for a pixel in the display area DA, the first resist 7A is provided with an opening so that a donor (or an acceptor) is implanted to only the region SC4 serving as an electrode of the holding capacitance and the region SC4's vicinity, of the semiconductor layer SC1, as shown in FIG. 8B.

The method for manufacturing the first resist 7 has been described in the first embodiment, so it will not be described in detail.

Next, the first resist 7A undergoes, for example, ashing so as to be made thinner in its entirety by the thickness of the first resist 7A in the region AR5. Thus, a second resist 7B that covers the region AR2 and has openings in the regions AR5 and AR4 is formed, as shown in FIG. 22. Then, a third impurity IMS3 (acceptor or donor) is implanted to the semiconductor layer SC1 via the second insulating layer 102 so that the carrier concentration of the semiconductor layer SC1 is different from that of the semiconductor layer SC2. If an accepter is implanted, the carrier concentration of the semiconductor layer SC1 is made higher than that of the semiconductor layer SC2 by the concentration of the accepter implanted in this step. If a donor is implanted, the carrier concentration of the semiconductor layer SC1 is made lower than that of the semiconductor layer SC2 by the difference between the concentration of the accepter implanted in the previous step and the concentration of the donor implanted in this step. This allows formation of a channel implant for controlling the threshold of the second nMOS. Note that since it is sufficient to control the threshold in this step, the semiconductor layer SC1 may be made into an n-type semiconductor. Also, which of an acceptor and a donor is to be implanted as the third impurity IMS3, the concentration of an acceptor or donor to be implanted, or the like may be set up arbitrarily.

In this step, an acceptor or donor is also implanted to the semiconductor layer SC4. However, since the semiconductor layer SC4 has been made into a high concentration n-type semiconductor in the previous step, it remains an n-type semiconductor even if an acceptor is implanted to it.

Then the second resist 7B is eliminated. Thus, the semiconductor layer SC2 is made into a p-type semiconductor, the semiconductor layer SC1 is made into a p-type semiconductor, and the semiconductor layer SC4 is made into an n-type semiconductor whose concentration is higher that that of the semiconductor layer SC1, as shown in FIG. 23.

In the steps up to here, the two resists, that is, the first and second resists 7A and 7B have been formed on the second insulating layer 102 for the purpose of ion-implanting the first, second, and third impurities IMS1, IMS2, and IMS3. However, it is sufficient for only the first resist 7A to be formed by exposing, developing, and baking a photosensitive resist because the second resist 7B is formed by thinning the first resist 7A by ashing or the like.

In the second embodiment, first, the semiconductor layers SC2, SC1, and SC4 are made into p-type semiconductors, and then impurities are implanted to the semiconductor layers SC1 and SC4 using the first and second resists 7A and 7B. However, also in the second embodiment, instead of implanting the first impurity IMS1 to the semiconductor layers SC2, SC1, and SC4 prior to forming the first resist 7A, impurities may be implanted to the semiconductor layers SC1 and SC4 using the first and second resists 7A and 7B, and then the resist 7B may be eliminated and the first impurity IMS1 (acceptor) may be implanted to the semiconductor layers SC2, SC1, and SC4 in the state shown in FIG. 23.

After having made the semiconductor layer SC2 into a p-type semiconductor, the semiconductor layer SC1 into a p-type semiconductor that is different in acceptor concentration (carrier concentration) from that of the semiconductor layer SC2, and the semiconductor layer SC4 into a high concentration n-type semiconductor in the above-mentioned procedure, a gate electrode and another electrode of the capacitor are formed and impurities are ion-implanted to the source and drain regions of the semiconductor layers SC2 and SC1 so as to the first and second nMOSs.

The procedure for forming a gate electrode and anther electrode of the capacitor is similar to what has been described in the first embodiment. A conductive film 8 is formed on the second insulating layer 102, and then an etching resist 9 is formed on the conductive film 8 so as to perform isotropic etching.

Then, as shown in FIG. 24, a fourth impurity IMS4 (donor) is implanted to the semiconductors SC2 and SC1 via the second insulating layer 102 while leaving the etching resist 9 intact.

This step is a first step in the step of making the source and drain regions of the semiconductor layer SC2 into high concentration regions n-type T11 and T13 and low concentration regions n-type T12 and T14, respectively, as well as making the source and drain regions of the semiconductor layer SC1 into high concentration n-type regions T2 and T4 and low concentration n-type regions T3 and T5, respectively. Therefore, the amount of a donor to be implanted to the semiconductor layers SC2 and SC1 in this step is set up such that the concentrations of the donor in the semiconductor layers SC2 and SC1 are higher than those of the acceptor already implanted to these semiconductor layers.

While the donor is also implanted to the semiconductor layer SC4 in this step, it is no problem that the semiconductor layer SC4 undergoes such donor implantation because the semiconductor layer SC4 has already become a high concentration n-type region Tn (T9).

Next, the etching resist 9 is eliminated, and then, as shown in FIG. 25, a fifth impurity IMS5 (donor) is implanted to the semiconductor layers SC2 and SC1 via the second insulating layer 102 using a gate electrode GP2 and an upper electrode (holding capacitance line StL) as masks.

This step is a second step in the step of making the source and drain regions of the semiconductor layer SC2 into high concentration regions n-type T11 and T13 and low concentration regions n-type T12 and T14, respectively, as well as making the source and drain regions of the semiconductor layer SC1 into high concentration n-type regions T2 and T4 and low concentration n-type regions T3 and T5, respectively. Therefore, the amount of a donor to be implanted to the semiconductor layers SC2 and SC1 in this step is set up such that the concentrations of the donor in the semiconductor layers SC2 and SC1 are higher than those of the acceptor already implanted to these semiconductor layers. In this case, the high concentration n-type regions T11 and T13 in the semiconductor layer SC2 of the first nMOS has already become n-type regions in the previous step, so these regions become higher in donor concentration than the low concentration n-type regions T12 and T14 accordingly. Similarly, the high concentration n-type regions T2 and T4 in the semiconductor layer SC1 of the second nMOS have already become n-type regions in the previous step, so these regions become higher in donor concentration than the low concentration n-type regions T3 and T5 accordingly.

While the donor is also implanted to a part of the semiconductor layer SC4 in this step, it is no problem that the semiconductor layer SC4 undergoes such donor implantation because the semiconductor layer SC4 has already become a high concentration n-type region Tn (T9).

Next, the third insulating layer 103 is formed, a through hole is formed in the third insulating film 103, a conductive film is formed on the third insulating layer 103, and the conductive film is etched so as to form metal wiring, a video signal line, a source electrode, and the like. Thus, the first nMOS and second nMOS that are different in carrier concentration (acceptor concentration) and a capacitor that uses the high concentration n-type semiconductor layer SC4 as an electrode are formed, as shown in FIG. 16.

Also in the method for manufacturing a TFT substrate 1 according to the second embodiment, the two resists, that is, the first and second resists 7A and 7B are used when impurities are implanted to the three semiconductor layers so as to make these semiconductor layers into two p-type semiconductors and one n-type semiconductor. However, the second resist 7B is formed, for example, by ashing the first resist 7A. Therefore, it is sufficient for only the first resist 7A to be formed by exposing, developing, and baking a photosensitive resist. As a result, the cost and time for manufacturing the TFT substrate 1 (liquid crystal display panel) are reduced, as with the manufacturing method according to the first embodiment.

The second embodiment has been applied to a case in which only nMOSs are formed on the TFT substrate 1 as MOS transistors. However, without being limited to this, the manufacturing method according to the second embodiment is also applicable to a case in which only pMOSs are formed on the TFT substrate 1 as MOS transistors, as a matter of course.

In the second embodiment, the photosensitive resist is halftone-exposed at the formation of the first resist 7A, for example, so that the thickness of the first resist 7A is smaller in the region A5 than in the region AR2, as shown in FIG. 21. However, without being limited to this, the photosensitive resist may be halftone-exposed so that the thickness of the first resist 7A is smaller in the region AR2 than in the region AR5.

Third Embodiment

Figure 26:
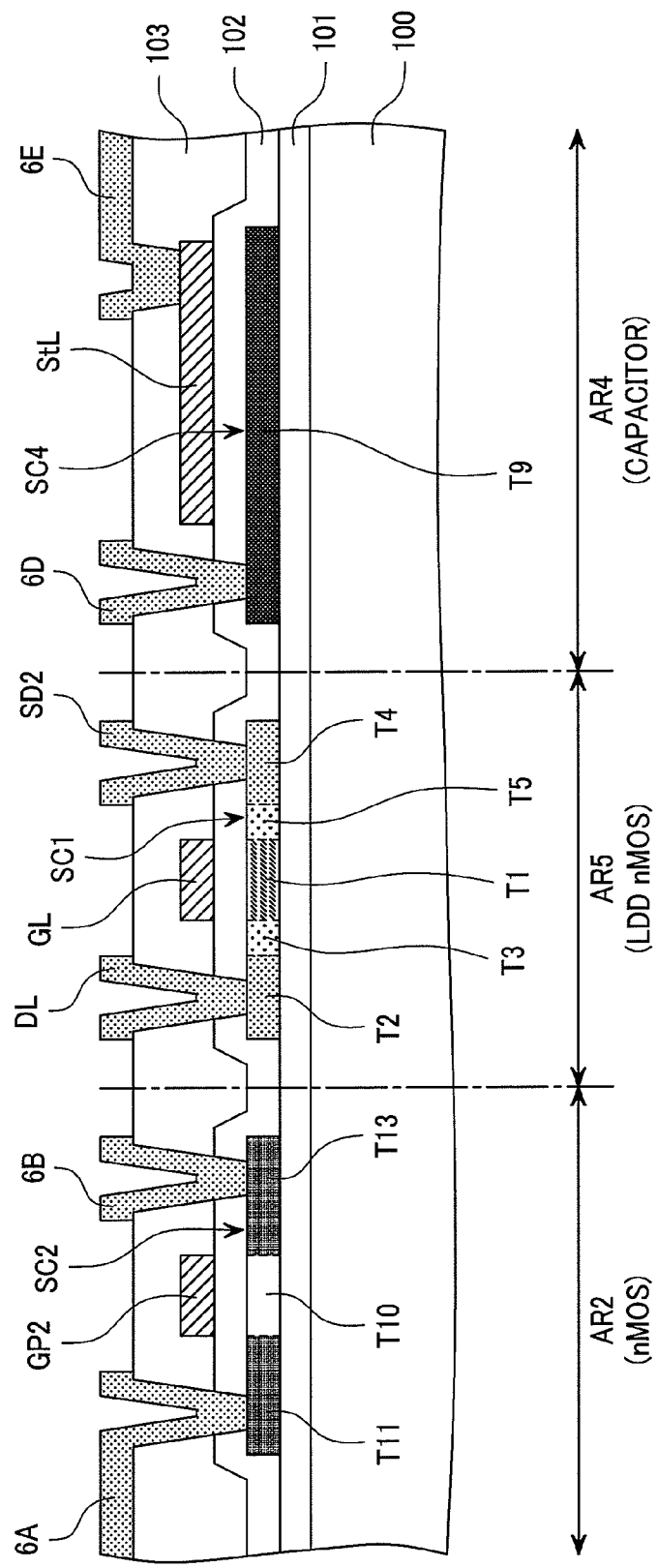
FIG. 26 is a schematic sectional view showing an example of the configuration of MOS transistors and a capacitor formed using a manufacturing method according to a third embodiment of the present invention.

FIG. 26 is a schematic sectional view showing an example of the configuration of MOS transistors and a capacitor formed using a manufacturing method according to a third embodiment of the present invention.

A method for manufacturing a TFT substrate 1 according to the third embodiment will be described using a case in which two types of nMOSs that are different in source and drain configurations and a capacitor that uses a high concentration semiconductor layer as an electrode thereof are formed above the glass substrate 100.

The sectional configuration of a region AR4 for forming a capacitor shown in FIG. 26 is similar to that shown in the first embodiment (FIG. 5). It conceptually shows a portion related to the present invention, of the sectional configuration taken along line C-C' of FIG. 3A. Therefore, the configuration of the capacitor shown FIG. 26 will not be described.

The sectional configuration of a region AR2 for forming a first nMOS shown in FIG. 26 corresponds to the sectional configuration taken along line D-D' of FIG. 4A. The source and drain regions of a semiconductor layer SC2 include n-type regions T11 and T13 each having a given donor concentration, respectively. The sectional configuration of a region AR5 for forming a second nMOS shown in FIG. 26 conceptually shows a portion related to the present invention, of the sectional configuration taken along line B-B' of FIG. 3B. In other words, the first nMOS is, for example, an nMOS to be used in a first drive circuit DRV1 or a second drive circuit DRV2, and the second nMOS is, for example, an active element to be arranged in a matrix in a display region DA. Therefore, the configurations of the first and second nMOSs will not be described.

Also in the manufacturing method of a TFT substrate 1 according to the third embodiment, the first and second nMOSs are different in the source and drain configurations of the semiconductor layer SC2 and a semiconductor layer SC1, as well as are different in the microscopic configuration (crystallinity) of polycrystalline silicon used to form the semiconductor layers SC2 and SC1. The semiconductor layer SC2 is made of, for example, polycrystalline silicon that is the aggregate of zonal crystals extending in an elongated manner in the movement direction of a carrier. The semiconductor layer SC1 of the second nMOS is made of polycrystalline silicon or amorphous silicon that is the aggregate of microcrystals, granular crystals, or the like and have many grain boundaries.

Therefore, to make the channel region T10 of the semiconductor layer SC2 and the channel region T1 of the semiconductor layer SC1 into p-type semiconductors, different concentrations of an acceptor must be implanted to these channel regions T10 and T1. While the channel regions T10 and T1 may be made into n-type semiconductors, different concentrations of a donor must be implanted to these channel regions T10 and T1 as well.

A procedure for forming the first nMOS, the second nMOS, and a capacitor having the configurations shown in FIG. 26 will be described below.

FIGS. 27 to 30 are schematic diagrams showing an example of a manufacturing method of a TFT substrate according to the third embodiment.

Figure 27:
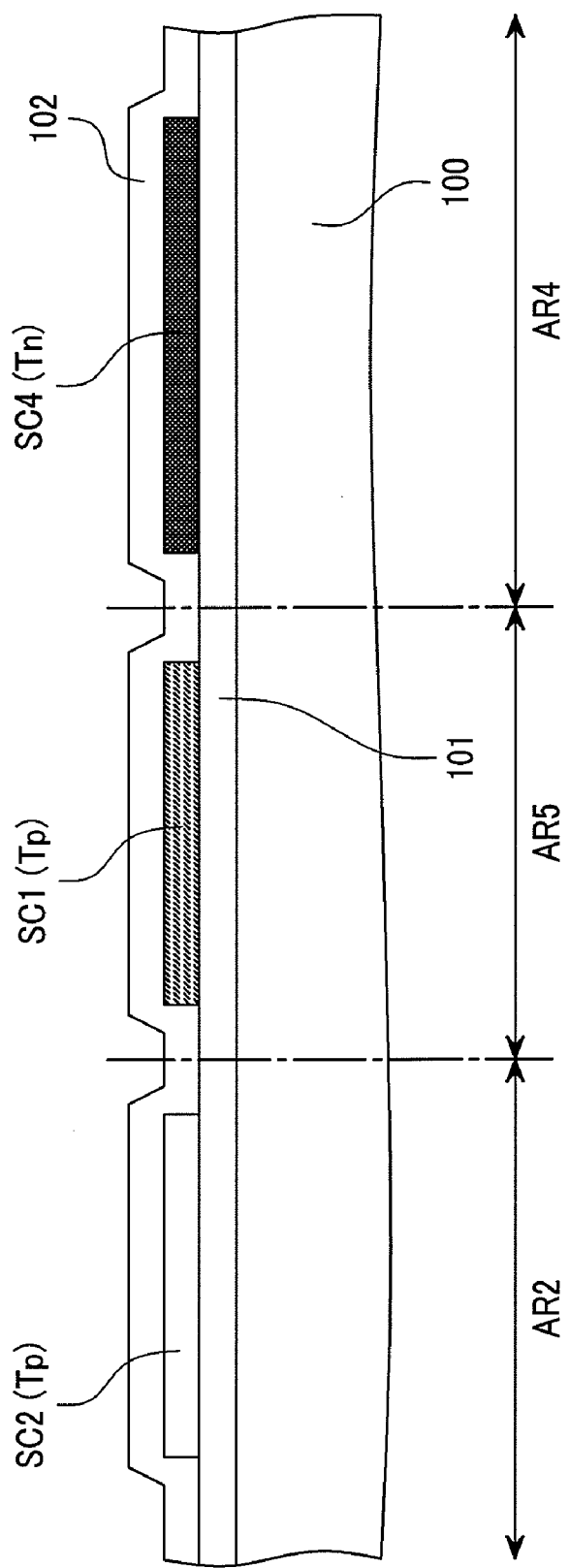
FIG. 27 is a schematic sectional view showing the state after, following implantation of impurities to semiconductor layers in three regions using first and second resists, and the second resist has been eliminated.

FIG. 27 is a schematic sectional view showing the state after, following implantation of impurities to semiconductor layers in three regions using first and second resists, the second resist has been eliminated.

Figure 28:
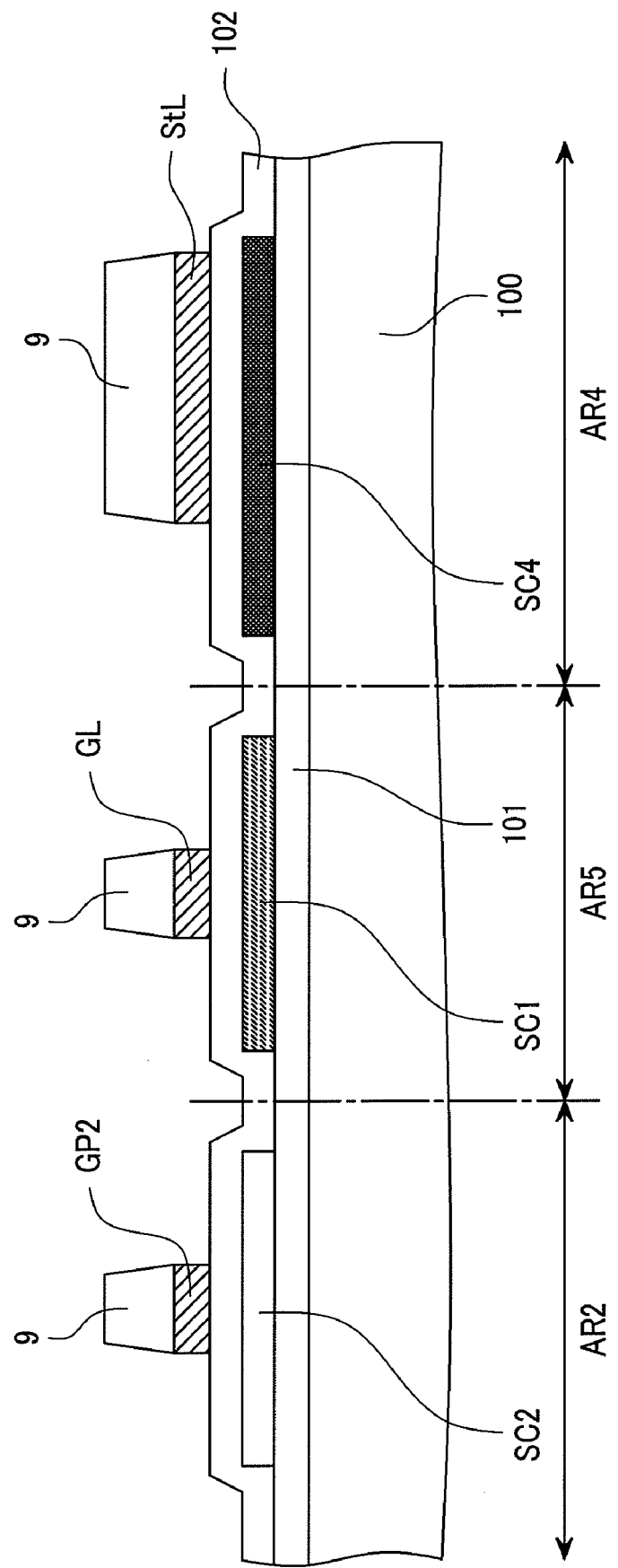
FIG. 28 is a schematic sectional view showing a step of forming the gate electrode of the nMOS and the upper electrode of the capacitor.

FIG. 28 is a schematic sectional view showing the step of forming a gate electrode of an nMOS and the upper electrode of a capacitor.

Figure 29:
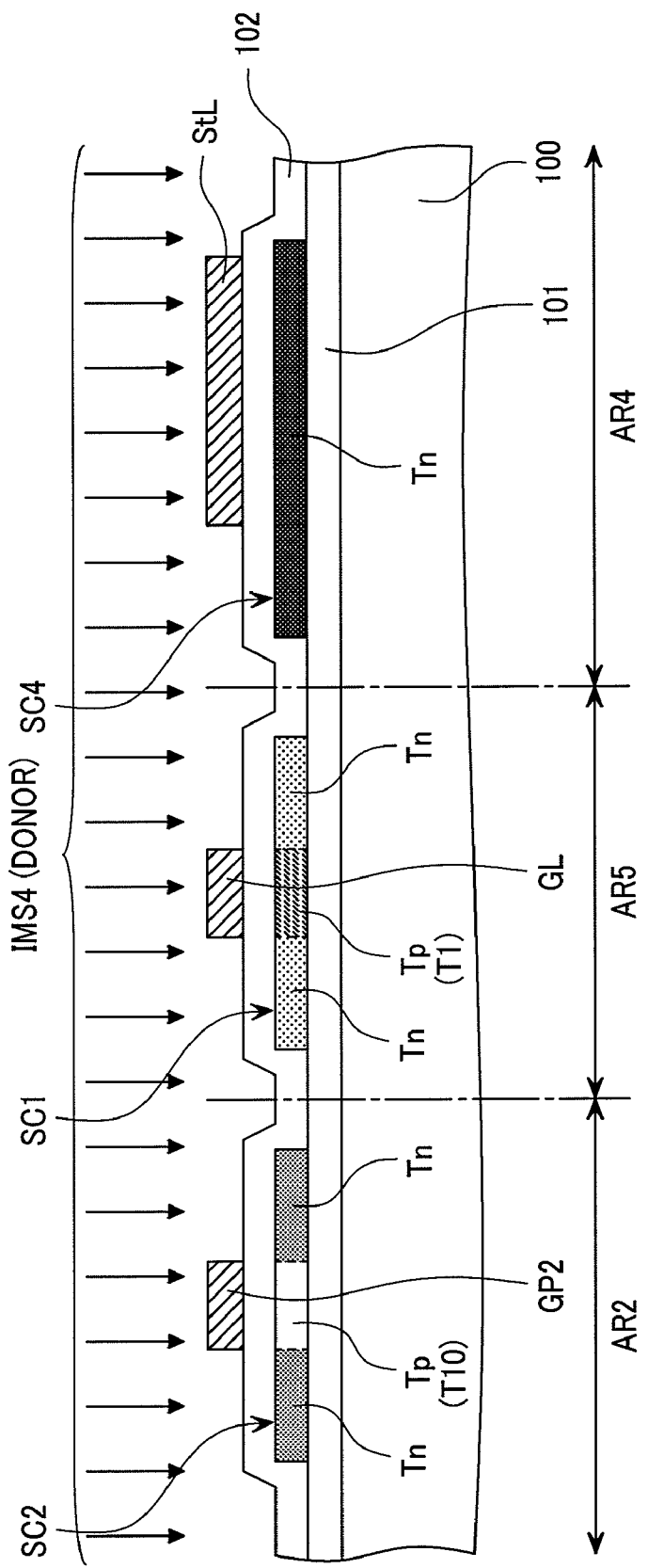
FIG. 29 is a schematic plan view showing a first step in a step of forming n-type regions in the semiconductor layer in the region forming the first nMOS and the semiconductor layer in the region forming the second nMOS.

FIG. 29 is a schematic plan view showing a first step in the step of forming n-type regions in a semiconductor layer in a region forming a first nMOS and a semiconductor layer in a region forming a second nMOS.

Figure 30:
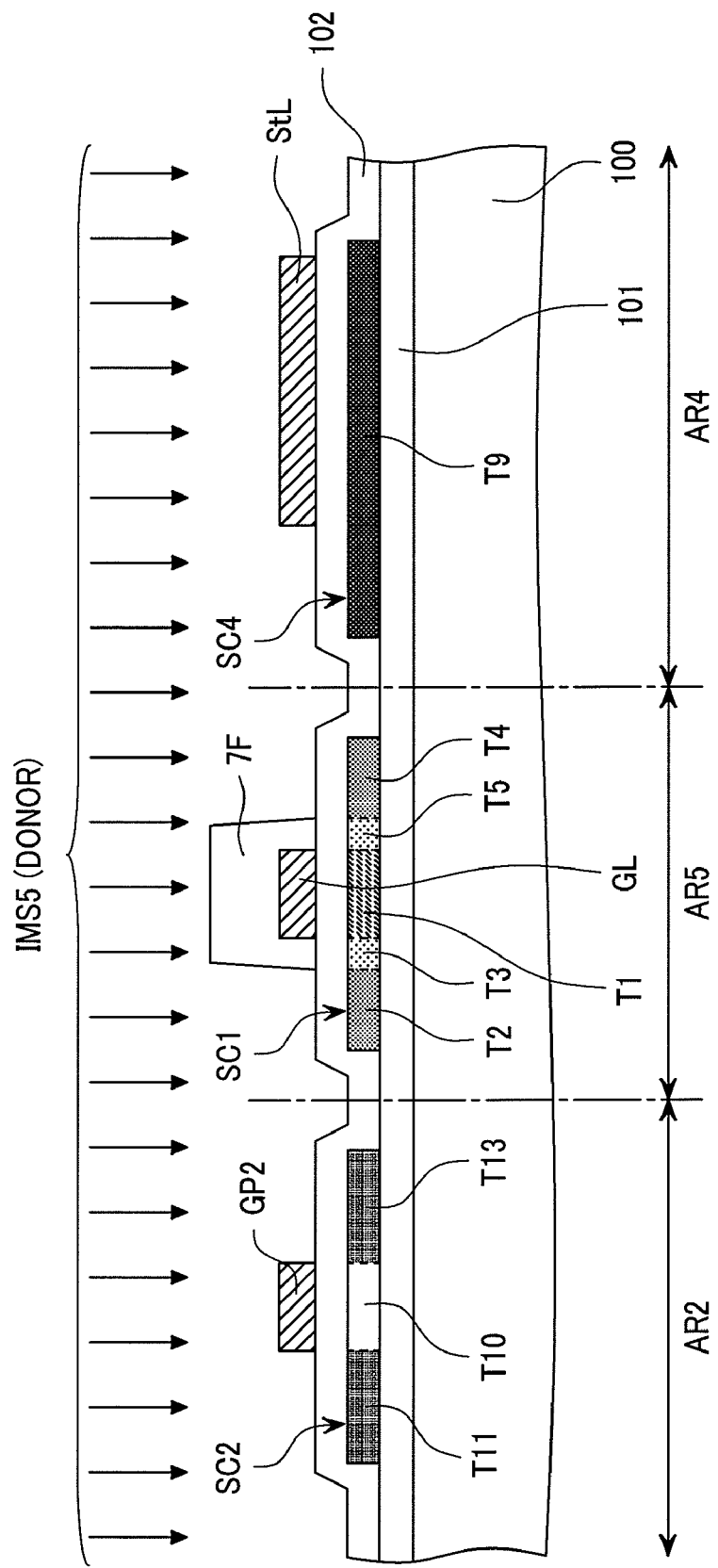
FIG. 30 is a schematic plan view showing a second step in the step of forming n-type regions in the semiconductor layer in the region forming the first nMOS and the semiconductor layer in the region forming the second nMOS.

FIG. 30 is a schematic plan view showing a second step in the step of forming n-type regions in a semiconductor layer in a region forming a first nMOS and a semiconductor layer in a region forming a second nMOS.

In the manufacturing method of a TFT substrate 1 according to the third embodiment, first, a first insulating layer 101, semiconductor layers SC2, SC1, and SC4, and a second insulating layer 102 are formed on a surface of a glass substrate 100, as shown in FIG. 27. Then, for example, the semiconductor layer SC2 in a region AR2 for forming a first nMOS is made into a p-type semiconductor, the semiconductor layer SC1 in a region AR5 for forming a second nMOS is made into a p-type semiconductor that is different in acceptor concentration from the semiconductor layer SC2, and the semiconductor layer SC4 in a region AR4 for forming a capacitor is made into an n-type semiconductor. The semiconductor layer SC2 is made of, for example, polycrystalline silicon that is the aggregate of zonal crystals 10w, and the semiconductor layers SC1 and SC4 are each made of polycrystalline silicon that is the aggregate of minute crystals 10p. It is sufficient to perform the steps up to here, particularly, the steps of implanting first, second, and third impurities IMS1, IMS2, and IMS3 using a procedure similar to that described in the second embodiment, so these steps will be not be described in detail.

After having made the semiconductor layer SC2 into a p-type semiconductor, the semiconductor layer SC1 into a p-type semiconductor that is different in acceptor concentration from the semiconductor layer SC2, and the semiconductor layer SC4 into a high concentration n-type semiconductor, a gate electrode and another electrode of the capacitor are formed. Then, impurities are ion-implanted to the source and drain regions of the semiconductor layers SC2 and SC1. Thus, the first and second nMOSs are formed.

The procedure for forming the gate electrode, a scan signal line, and another electrode (holding capacitance line) of the capacitor is similar to what has been described in the first embodiment. That is, a conductive film 8 is formed on the second insulating layer 102, and then an etching resist 9 is formed on the conductive film 8. Note that anisotropic etching is performed in the manufacturing method according to the third embodiment so that none of the gate electrode GP2, the scan signal line GL, and the upper electrode (holding capacitance line StL) of the capacitor is side-etched (undercut). When etching the conductive film 8, isotropic etching may be performed as in the first and second embodiments.

Next, the etching resist 9 is eliminated, and then, as shown in FIG. 29, a fourth impurity IMS4 (donor) is implanted to the semiconductor layers SC2 and SC1 via the second insulating layer 102 using the gate electrode GP2, the scan signal line GL, and the upper electrode (holding capacitance line StL) as masks.

This step is a first step in a step of making the source and drain regions of the semiconductor layer SC2 into n-type regions T11 and T13, respectively, as well as making the source and drain regions of the semiconductor layer SC1 into high concentration n-type regions T2 and T4 and low concentration n-type regions T3 and T5. This step is also intended to form low concentration n-type regions T3 and T5 in the semiconductor layer SC1. Therefore, the amount of a donor to be implanted to the semiconductor layers SC2 and SC1 in this step is set up such that the concentrations of the donor in the semiconductor layers SC2 and SC1 are higher than those of the acceptor already implanted to these semiconductor layers and such that the low concentration n-type regions T3 and T5 of the semiconductor SC1 each have a required donor concentration.

While the donor is also implanted to a part of the semiconductor layer SC4 in this step, it is no problem that the semiconductor layer SC4 undergoes such donor implantation because the semiconductor layer SC4 has already become a high concentration n-type region Tn (T9).

Next, as shown in FIG. 30, a fourth resist 7F is formed on the upper and side surfaces of the scan signal line GL in the region AR5. Then, a fifth impurity (donor) is implanted to the semiconductor layers SC2 and SC1 via the second insulating layer 102. The fourth resist 7F is formed so as to be 1 or 2 μm larger in width than the scan signal line GL so that the low concentration regions T3 and T5 of the semiconductor layer SC1 remain in the proximity of the channel region thereof.

This step is a second step in the step of making the source and drain regions of the semiconductor layer SC2 into n-type regions T11 and T13, respectively, as well as making the source and drain regions of the semiconductor layer SC1 into high concentration n-type regions T2 and T4 and low concentration n-type regions T3 and T5. This step is also intended to increase the donor concentrations of the n-type regions T11 and T13 that are the source and drain regions, respectively, of the semiconductor layer SC2, as well as to make the source and drain regions of the semiconductor layer SC1 into the high concentration n-type regions T2 and T4 and the low concentration n-type regions T3 and T5. Therefore, the amounts of a donor to be implanted are set up such that the n-type regions T1 and T13 serving as the source and drain regions, respectively, of the semiconductor layer SC2 each have a required donor concentration and such that the high concentration n-type regions T2 and T4 serving as the source and drain regions, respectively, of the semiconductor layer SC1 each have a required donor concentration.

While the donor is also implanted to a part of the semiconductor layer SC4 in this step, it is no problem that the semiconductor layer SC4 undergoes such donor implantation because the semiconductor layer SC4 has already become a high concentration n-type region Tn (T9).

Next, the resist 7F is eliminated, and then a third insulating layer 103 is formed, a through hole is formed in the third insulating film 103, a conductive film is formed on the third insulating layer 103, and the conductive film is etched so as to form metal wiring, a video signal line, a source electrode, and the like. Thus, the first nMOS and second nMOS that are different in carrier concentration (acceptor concentration) and source and drain configurations, and a capacitor that uses the high concentration n-type semiconductor layer SC4 as an electrode thereof are formed, as shown in FIG. 26.

Also in the manufacturing method of a TFT substrate 1 according to the third embodiment, the two resists, that is, the first and second resists 7A and 7B are used when impurities are implanted to the three semiconductor layers so as to make these semiconductor layers into two p-type semiconductors and one n-type semiconductor. However, the second resist 7B is formed, for example, by ashing the first resist 7A. Therefore, it is sufficient for only the first resist 7A to be formed by exposing, developing, and baking a photosensitive resist. As a result, the cost and time for manufacturing the TFT substrate 1 (liquid crystal display panel) are reduced, as with the manufacturing method according to the first embodiment.

The third embodiment has been applied to a case in which only nMOSs are formed on the TFT substrate 1 as MOS transistors. However, without being limited to this, the manufacturing method according to the third embodiment is also applicable to a case in which only pMOSs are formed on the TFT substrate 1 as MOS transistors, as a matter of course.

Also in the third embodiment, the first resist 7A may be formed so as to be thinner in the region AR5 than the region AR2 or may be formed so as to be thinner in the region AR2 than the region AR5.

While the present invention has been described in detail on the basis of the embodiments, the invention is not limited thereto. As a matter of course, various modifications can be made to those embodiments without departing from the spirit and scope of the invention.

For example, the methods for manufacturing a TFT substrate 1 having the configurations shown in FIGS. 3A to 3D and FIGS. 4A and 4B or the configurations similar to such configurations have been described in the first to third embodiments. However, without being limited to these configurations, the present invention is applicable to any TFT substrate in which impurities must be implanted to semiconductor layers formed in three different regions so as to make those semiconductor layers into three types of semiconductor layers that are different in carrier type or carrier concentration, without regard to combinations of conductivity types of the semiconductor layers or functions of the semiconductor layers. In other words, the present invention is also applicable, for example, to a case in which semiconductor layers formed in three different regions are made into three types of n-type semiconductor layers or p-type semiconductor layers that are different in carrier concentration.

A lateral electric field drive system liquid crystal display panel (TFT substrate 1) called an IPS system has been used as an example in the first to third embodiments. However, without being limited to this, the manufacturing methods according to the present invention are also applicable to a manufacturing method of a TFT substrate 1 adopting a vertical electric field drive system, such as a vertical alignment (VA) system or a twisted nematic (TN) system.

In the first to third embodiments, the manufacturing methods of a TFT substrate 1 to be used in an active matrix liquid crystal display device (liquid crystal display panel) have been described. However, without being limited to this, the present invention is applicable to any TFT substrate that is of active matrix type having a similar configuration and in which impurities must be implanted to semiconductor layers formed in three different regions so as to make those semiconductor layers into three types of semiconductor layers that are different in carrier type or carrier concentration, regardless of functions of those semiconductor layers. In other words, the present invention is also applicable, for example, when a self-luminous display panel using organic electroluminescence is manufactured.

The first to third embodiments have been applied to cases in which semiconductor layers of MOS transistors (TFTs) are made of silicon. However, the semiconductor layers may be made of a material other than silicon as a matter of course.

What is claimed is:

1. A manufacturing method of a display device, comprising the steps of:
   forming a semiconductor film above a substrate; and
   implanting an impurity to each of a first semiconductor film in a first region of the substrate, a second semiconductor film in a second region outside the first region, and a third semiconductor film in a third region outside the first and second regions, wherein
   the implanting step includes the steps of:
   (a) forming a first resist above the substrate so as to be thicker in the first region than in the second region, the first resist covering the first and second regions and having an opening in the third region;
   (b) implanting an impurity to only the third semiconductor film in the third region using the first resist as a mask;
   (c) thinning the first resist so as to form a second resist that covers the first region and has an opening in each of second and third regions;
   (d) implanting an impurity to the second and third semiconductor films in the second and third regions simultaneously using the second resist as a mask;
   (e) implanting an impurity to the first to third semiconductor films in the first to third regions simultaneously; and
   (f) forming a capacitor in the third region.

2. The display device manufacturing method according to claim 1,
   wherein step (e) is performed after the second resist is eliminated subsequently to step (d).

3. The display device manufacturing method according to claim 1,
   wherein step (e) is performed before step (a).

4. The display device manufacturing method according to claim 1,
   wherein: one of steps (b) and (e) is the step of implanting an impurity for forming an n-type semiconductor, and the other step is the step of implanting an impurity for forming a p-type semiconductor; and
   an amount of an impurity to be implanted in step (b) is larger than an amount of an impurity to be implanted in step (e).

5. The display device manufacturing method according to claim 1,
   wherein one of steps (d) and (e) is the step of implanting an impurity for forming an n-type semiconductor, and the other step is the step of implanting an impurity for forming a p-type semiconductor.

6. The display device manufacturing method according to claim 5,
   wherein an amount of an impurity to be implanted in step (d) is larger than an amount of an impurity to be implanted in step (e).

7. The display device manufacturing method according to claim 5,
wherein an amount of an impurity to be implanted in step (d) is smaller than an amount of an impurity to be implanted in step (e).

8. The display device manufacturing method according to claim 1,
wherein steps (d) and (e) are each the step of implanting an impurity for forming a semiconductor of identical conductivity type.

9. The display device manufacturing method according to claim 1,
further comprising the step of forming a capacitor in the third region after steps (a) to (e), the capacitor using, as an electrode, the third semiconductor film that has undergone implantation of the impurity.

10. The display device manufacturing method according to claim 1,
further comprising the step of, after steps (a) to (e), implanting an additional impurity to each of the first and second semiconductor films in the first and second regions and partitioning each of the first and second semiconductor films into a channel region, a drain region, and a source region so as to form a metal insulator semiconductor transistor.

11. The display device manufacturing method according to claim 1,
wherein the step of forming the semiconductor film above the substrate includes the steps of:
forming an amorphous silicon film above the substrate;
converting a part or all of the amorphous silicon film into polycrystalline silicon; and
etching the semiconductor film so as to form the first to third semiconductor films in the first to third regions, respectively.

12. The display device manufacturing method according to claim 11,
wherein the step of converting a part or all of the amorphous silicon film into polycrystalline silicon includes the steps of:
converting a part or all of the amorphous silicon film into first polycrystalline silicon, the first polycrystalline silicon being an aggregate of a microcrystal or a granular crystal; and
converting a part or all of the first polycrystalline silicon into second polycrystalline silicon, the second polycrystalline silicon being an aggregate of a zonal crystal extending in an elongated manner approximately in one direction.

13. The display device manufacturing method according to claim 1,
further comprising the step of, after steps (a) to (e), forming a transistor of one conductivity type of p-type and n-type using the first semiconductor film in the first region, forming a transistor of conductivity type opposite to the conductivity type of the transistor in the first region using the second semiconductor film in the second region, and forming a capacitor using the third semiconductor film in the third region.

14. The display device manufacturing method according to claim 1,
further comprising the step of, after steps (a) to (e), forming a first transistor of one of p-type and n-type using the first semiconductor film in the first region, forming a second transistor of conductivity type identical to the conductivity type of the first transistor using the second semiconductor film in the second region, and forming a capacitor using the third semiconductor film in the third region.

15. The display device manufacturing method according to claim 14,
wherein: one of the first semiconductor film of the first transistor and the second semiconductor film of the second transistor is polycrystalline silicon made that is an aggregate of a zonal crystal; and
the other semiconductor film is polycrystalline silicon that is an aggregate of a microcrystal or a granular crystal.

16. A manufacturing method of a display device, comprising the steps of:
forming a semiconductor film above a substrate; and
implanting an impurity to each of a first semiconductor film in a first region of the substrate, a second semiconductor film in a second region outside the first region, and a third semiconductor film in a third region outside the first and second regions, wherein
the implanting step includes the steps of:
(a) forming a first resist above the substrate using half-exposure so as to be thinner in the second region than in the first region, the first resist covering the first and second regions and having an opening in the third region;
(b) implanting an impurity to only the third semiconductor film in the third region using the first resist as a mask;
(c) thinning the first resist so as to form a second resist that covers the first region and has an opening in each of second and third regions;
(d) implanting an impurity to the second and third semiconductor films in the second and third regions simultaneously using the second resist as a mask; and
(e) implanting an impurity to the first to third semiconductor films in the first to third regions simultaneously.

17. The display device manufacturing method according to claim 16,
wherein step (e) is performed after the second resist is eliminated subsequently to step (d).

18. The display device manufacturing method according to claim 16,
wherein step (e) is performed before step (a).

19. The display device manufacturing method according to claim 16,
wherein: one of steps (b) and (e) is the step of implanting an impurity for forming an n-type semiconductor, and the other step is the step of implanting an impurity for forming a p-type semiconductor; and
an amount of an impurity to be implanted in step (b) is larger than an amount of an impurity to be implanted in step (e).

20. The display device manufacturing method according to claim 16,
wherein one of steps (d) and (e) is the step of implanting an impurity for forming an n-type semiconductor, and the other step is the step of implanting an impurity for forming a p-type semiconductor.

* * * * *